United States Patent [19]
Ovshinsky et al.

[11] Patent Number: 4,766,471
[45] Date of Patent: Aug. 23, 1988

[54] THIN FILM ELECTRO-OPTICAL DEVICES

[75] Inventors: Stanford R. Ovshinsky, Bloomfield Hills; Robert R. Johnson, Franklin; Stephen J. Hudgens, Southfield; Roger W. Pryor, Bloomfield Hills; Guy C. Wicker, Rochester Hills; Robert S. Nolan, Saint Clair Shores, all of Mich.

[73] Assignee: Energy Conversion Devices, Inc., Troy, Mich.

[21] Appl. No.: 821,643

[22] Filed: Jan. 23, 1986

[51] Int. Cl.[4] .............................................. H01L 31/12
[52] U.S. Cl. .......................................... 357/19; 357/2; 357/17
[58] Field of Search ................................ 357/19, 2, 17

[56] References Cited

U.S. PATENT DOCUMENTS

| | | | |
|---|---|---|---|
| 4,274,104 | 6/1981 | Fang | 357/19 |
| 4,368,481 | 1/1983 | Ohashi | 357/19 X |
| 4,667,212 | 5/1987 | Nakamura | 357/19 |

Primary Examiner—Martin H. Edlow
Attorney, Agent, or Firm—Marvin S. Siskind; Richard M. Goldman

[57] ABSTRACT

An electro-optical communication device which includes a light transmissive conduit integrally formed to interconnect a light emitter and a light detector. The length over which the light transmissive conduit extends is substantially greater than the size of either the light emitter or the light detector. In the preferred embodiment, the light emitter and the light detector are each formed from amorphous semiconductor alloy material and may be substantially surrounded by the light transmissive conduit.

9 Claims, 21 Drawing Sheets

FIG. IE
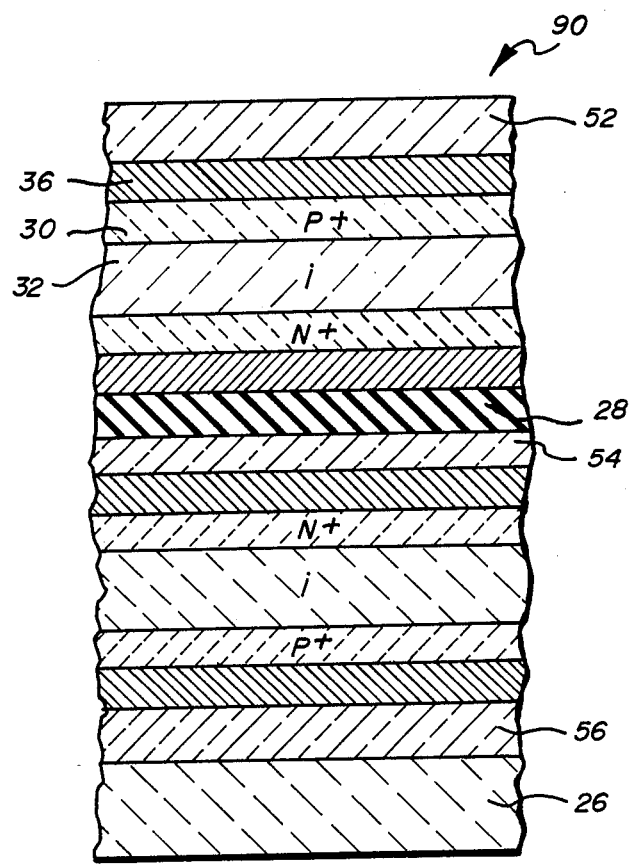
FIG. IF
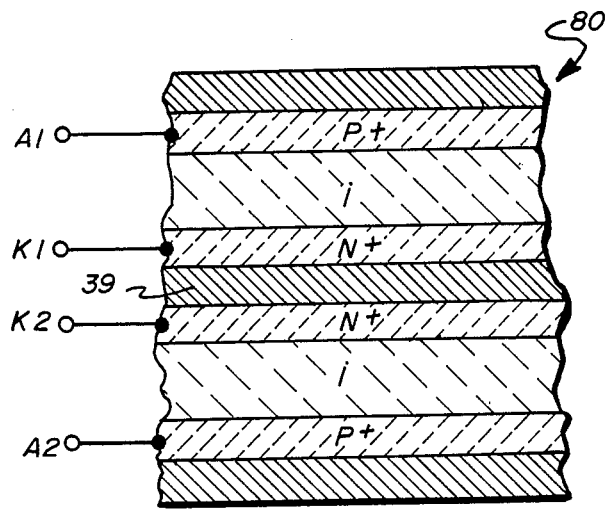
FIG. IG
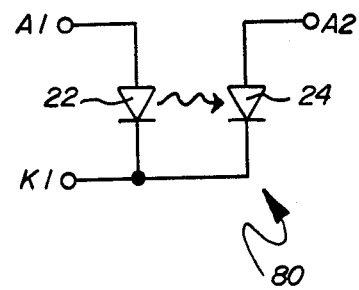

*FIG. 16B*
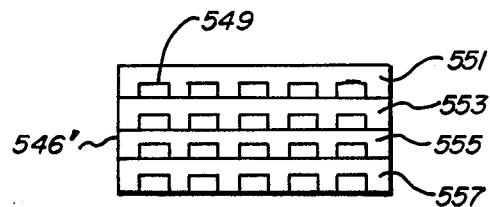
*FIG. 16A*
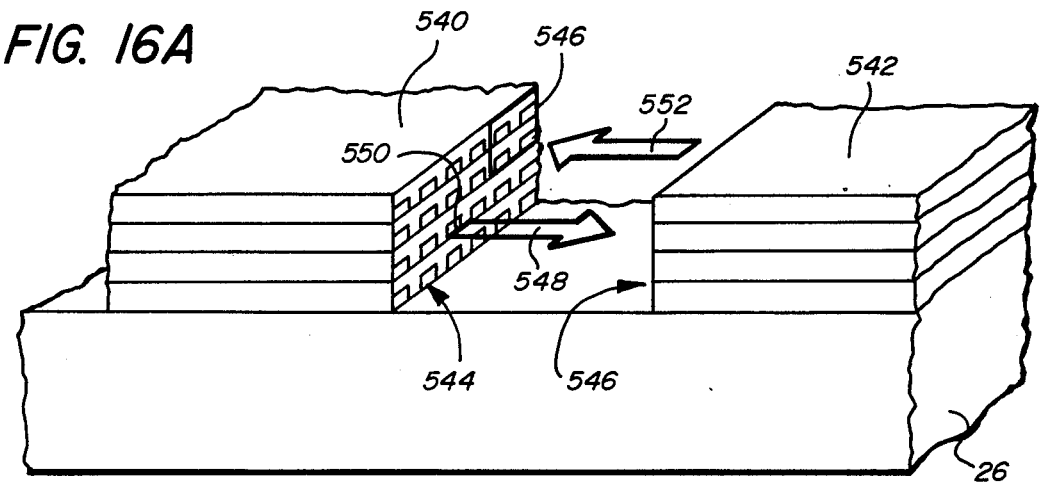
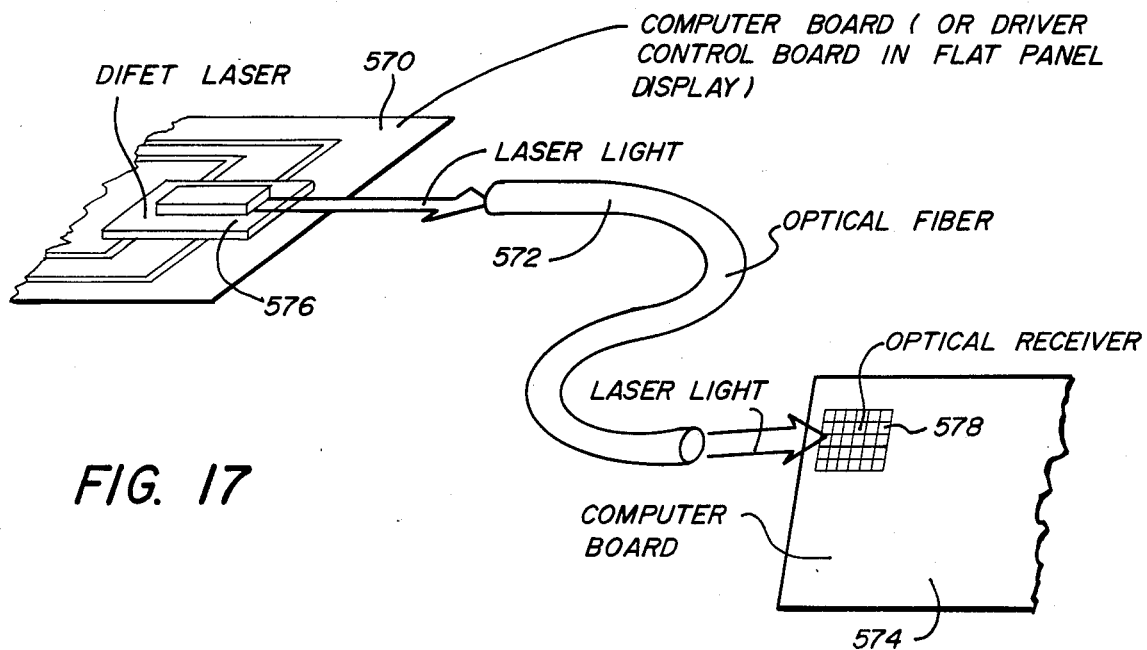
*FIG. 17*

THIN FILM ELECTRO-OPTICAL DEVICES

FIELD OF THE INVENTION

This invention relates generally to electro-optical devices and more particularly to thin film photoresponsive devices, thin film photovoltaic devices, and thin film transistors capable of detecting and/or emitting optical radiation, and combinations of such devices. The present invention is particularly adapted to provide electrical-to-optical, optical-to-electrical, and optical-to-optical communication and electrical and optical isolation in thin film integrated circuit structures, including multi-layered three dimensional integrated circuit structures constructed by using multiple layers or planes of devices, and optical-to-optical communications between two or more such structures.

BACKGROUND OF THE INVENTION

Photoresponsive and photovoltaic materials and devices constructed using thin film technology have been extensively investigated in the last two decades. Recently, considerable efforts have been made to develop systems for depositing polycrystalline, microcrystalline or amorphous semiconductor materials, each of which can encompass relatively large areas, and which can be doped to form p-type and n-type materials for the production of p-i-n and n-i-p type photovoltaic devices which are, in operation, substantially equivalent to their crystalline counterparts. It is to be noted that the term "amorphous", as used herein, includes all materials or alloys which have no long range order, although they may have short or intermediate range order or even contain, at times, crystalline inclusions.

It is now possible to prepare amorphous silicon alloys by glow discharge or vacuum deposition techniques, said alloys possessing (1) acceptable concentrations of localized defect states in the energy gaps thereof, and (2) high quality electrical and optical properties. Such deposition techniques are fully described in U.S. Pat. No. 4,226,898, entitled Amorphous Semiconductors Equivalent To Crystalline Semiconductors, issued in the names of Stanford R. Ovshinsky and Arun Madan on Oct. 7, 1980; U.S. Pat. No. 4,217,374, issued in the names of Stanford R. Ovshinsky and Masatsugu Izu on Aug. 12, 1980, also entitled Amorphous Semiconductors Equivalent To Crystalline Semiconductors; and U.S. Pat. No. 4,517,223, issued in the names of Stanford R. Ovshinsky, David D. Allred, Lee Walter, and Stephen J. Hudgens on May 14, 1985 and entitled Method Of Making Amorphous Semiconductor Alloys And Devices Using Microwave Energy. As disclosed in these patents, which are assigned to the assignee of the instant invention and the disclosure of which are incorporated by reference, fluorine introduced into the amorphous silicon semiconductor layers operates to substantially reduce the density of the localized defect states therein and facilitates the addition of other alloying materials, such as germanium.

To enhance photovoltaic device efficiency, multiple photovoltaic cells are used. When these cells are arranged in layers, the individual cells are often provided with different band gaps to more efficiently collect various portions of the spectrum of light incident upon the cells, and to increase open circuit voltage (Voc). A tandem cell device is by definition a device which has two or more cells with the light directed serially through each cell. In the first cell, a large band gap material may absorb only the shorter wavelength light while in subsequent cells smaller band gap materials may absorb the longer wavelengths of light which pass through the first cell. The overall open circuit voltage in such a tandem device is the sum of the open circuit voltage of each cell. Such multiple cells preferably include a back reflector for increasing the percentage of incident light reflected from the substrate back through the semiconductor layers of the cells.

Considerable efforts are also being made to fabricate transistors and other semiconductor devices useful in integrated electronic circuits of non-crystalline semiconductor materials, such as amorphous silicon alloys. Such transistors are normally formed of thin films of deposited conductive, insulating, and amorphous semiconductor materials, and therefore are often called thin film transistors, or TFTs. Such TFTs are normally transistors in which the gate is insulated from the conductive channel between its two current carrying electrodes, and in which a voltage must be applied to to the gate in order to shift the Fermi level in the conduction channel sufficiently, so as to make the normally non-conducting channel conducting. Examples of such TFTs and descriptions of how they may be made are found in U.S. Pat. No. 4,547,789 entitled High Current Thin Film Transistor which issued on Oct. 15, 1985, U.S. Pat. No. 4,543,320 entitled Method Of Making A High Performance, Small Area Thin Film Transistor which issued on Sept. 24, 1985, and U.S. patent application Ser. No. 549,996 entitled High Performance, Small Area Thin Film Transistor, filed in the names of H. Fritzsche and R. Johnson on Nov. 8, 1983, and U.S. patent application Ser. No. 723,103 entitled Thin Film Transistor, filed in the names of R. Flasck and S. Holmberg on June 3, 1985. These patents and applications are also assigned to the assignee of the present invention and are hereby incorporated by reference herein.

Several major advancements in thin film transistor technology have been very recently made, and are described in detail in U.S. patent application Ser. No. 788,594 entitled Double Injection Field Effect Transistors, filed in the names of W. Czubatyj, M. Hack and M. Shur on Oct. 17, 1985. This application is also assigned to the assignee of the present invention, and is hereby incorporated by reference herein. This application is also assigned to the assignee of the present invention, and is hereby incorporated by reference herein. Although most of all the new transistor devices described therein are illustrated as amorphous semiconductor devices, the new principles announced therein are largely applicable to crystalline, polycrystalline, and microcrystalline devices as well. The double injection devices described therein operate by modulating the density and/or cross section of ambipolar current (which may be described as a plasma of electrons and holes) by using an electric field that extends along the current path and typically projects perpendicularly in to the current path. The devices are preferably constructed as field effect transistors having ambipolar current in the body of semiconductor between the current-carrying electrodes, which are called the anode and cathode. Both junction field effect transistors and insulated gate field effect transistors are described therein. Vertically arranged and horizontally arranged double injection field effect transistors are shown therein. The vertical embodiments of such transistors are called vertical modulated injection transistors (VMITs), and are formed by successively depositing various layers of conductive and semiconductive materials. The conductive layers serving as the gate of the transistor may or may not be insulated. Certain of these transistors feature multiple gates whic.h can be configured as AND, NOR or other logic gates. Certain embodiments of the DIFET disclosed in U.S. patent application Ser. No. 788,594 use space charged neutralization for even higher current handling capabilities. Some DIFETs disclosed therein, made preferably of amorphous silicon alloys, exhibit light emission. A DIFET laser made from such alloys is disclosed therein. Modulation of the amplitude and/or frequency of the DIFETs optical output by varying the gate voltage is also disclosed. Two of the electro-optical versions of the DIFET disclosed in application Ser. No. 788,594 are described further below, since they are shown in a number of illustrative embodiments of the present invention. These DIFET devices should prove to be of value in and spur the development of thin film circuits, chips and memories, some of which will be briefly described.

Integrated electronic structures may be made from thin film devices. One class of examples are the programmable electronic matrix arrays shown in U.S. Pat. No. 4,545,111 entitled Method Of Making, Parallel Preprogramming Or Field Programming Of Electronic Matrix Arrays which issued on Oct. 8, 1985, and U.S. Pat. No. 4,499,557 entitled Programmable Cell For Use In Programmable Electronic Arrays which issued on Feb. 12, 1985.

Very recently, the interest in three dimensional integrated electronic circuit structures has grown. Such structures may contain a million or more cells or various electronic devices, such as diodes and bistate memory devices. Several such structures are disclosed, for example, in U.S. patent application No. 655,961 entitled Programmable Semiconductor Structures And Methods For Using The Same, filed in the names of S. R. Ovshinsky, et al. on Sept. 28, 1984. Among other things, this application discloses multilayered structures of deposited layers of various materials including semiconductor alloy materials which are initially deposited as continuous layers. One type of structure disclosed is a programmable logic array having a plurality of vertically arranged layers initially deposited as continuous layers, and subsequently patterned to provide semiconductor interactions to implement individually programmable selected logic functions in various locations. Another type of multilayer structure disclosed therein has two or more programmable logic planes, one of which may be an AND logic plane and another of which may be an OR logic plane. This application also teaches various methods for interconnecting the layers of such a multilayered structure using vertically arranged conductors, and techniques for interconnecting such a structure to external electronic circuits, such as by down bonding leads to terminal pads on the various layers.

Such three dimensional integrated circuit structure are preferably constructed by using multiple layers of various thin film materials including amorphous semiconductor alloy materials, metallic conductors and insulating materials. As the number or the density of device in such structures is increased, the issues of how to efficiently, economically and reliably make connections between devices located on different planes of the structure, and of how to best communicate with devices and circuits external to the structure become increasingly important. One aspect of such connections or communication paths which deserves consideration, particularly in high density three dimensional structures, is electrical noise or cross talk between devices and conductors on the same plane, or on different planes of the device, or on conductors connecting the integrated structure to external circuit devices. It would be very advantageous to have connections and communication paths which inherently have a low susceptibility to electrical noise or cross-talk to minimize any potential problems in this regard. It would be advantageous to have a technique for building three dimensional structures which inherently minimize the electrical noise or cross talk between layers.

One of the distinct advantages of thin film devices and thin film integrated electronic structures is that they may be fabricated in very large areas, thus making possible the implementation of very large scale integration (VLSI) and ultra-large scale integration (ULSI) electronic circuitry, without the use of costly one micron or submicron geometries. Larger and much less expensive feature sizes, such as 5 microns to 20 microns or more may be used, since thin films may be reliably deposited and patterned over very large areas, with greater ease and higher yields than their crystalline counterpart semiconductors may be. Also, unlike crystalline silicon which must be epitaxially grown upon a crystalline silicon substrate, making it very difficult to build multiple layers of circuitry, thin films may be deposited in multiple layers or planes of devices, thereby yielding truly three dimensional structures. Accordingly, the assignee of the present invention is working to develop ultra-large capacity three dimensional thin film amorphous semiconductor memories and the necessary technology to construct a fully integrated thin film central processing unit or computer made from amorphous semiconductor materials.

In VLSI and ULSI electronic structures, transmission delays can be experienced over long conductors due to the capacitance of the conductors and its associated connections to various device electrodes. Also, as the number of long conductors in such a structure increases, device layout and conductor routing problems becomes more complex. Thus, any technqiues or devices which could alleviate such delays or reduce the number of long conductors would be quite beneficial.

Also, there is a great interest in developing large area flat panel displays using amorphous semiconductor technology. Those in flat panel display field recognize that one important technique for reducing the costs of such large area displays would be to fabricate the driver, logic, and addressing circuitry required for the active matrix of the displays on the glass substrate at the same time the amorphous thin film logic and/or switching elements for each pixel for the flat panel matrix are formed. However, as the number of active devices on the glass substrate increases, so too does the need for high speed, reliable control signal paths and data paths, both on the display substrate and between the substrate and the external circuits which provides the video and control information necessary to drive the display.

Accordingly, there is an on-going desire to improve the speed, current carrying capacity, over-all performance, reliability, noise immunity and ease of fabrication of all such thin film devices, and of all communication paths in thin film integrated electronic structures.

SUMMARY OF THE DISCLOSURE

To help satisfy the foregoing needs and desires and the present and anticipated need for thin film electro-optical devices for use in integrated structures, the present invention provides several solid-state electro-optical devices and optical-to-optical devices which may be constructed using thin film technology. These new devices should have great utility in improving the reliability and ease of implementing communications within complex thin film circuit structures of the future, such as computers and mass memory structures, and in implementing economical and reliable communications between such thin film integrated structures and external devices. Most of the new devices disclosed below are electronic thin film electro-optical devices having a photo-emitting device and a photo-receiving device coupled together as an integrated structure.

The invention provides an electro-optical device including an integrated structure which includes light generating means for emitting light responsive to an applied electrical stimulus and light-detecting means arranged in light receiving proximity to the light generating means for detecting and responding to the light emitted by the light generating means. The integrated structure is preferably a multilayered structure formed from a plurality of layers of deposited materials which include a first group of layers forming the light generating means and a second group of layers forming the light-detecting means. Preferably, the light generating means and light-detecting means are vertically arranged with respect to each other.

The invention further provides an electro-optical device including at least two integrated structures, each structure including light generating means responsive to an electric stimulus for projecting light toward the other structure and light-detecting means for detecting and responding to light received from the other structure. The structures could be formed on a common substrate and physically separated from each other. The structures preferably are multilayered structures formed from vertically arranged layers of deposited materials.

The present invention still further provides an electro-optical device including an integrated structure having light generating means for emitting light responsive to an electrical stimulus, light conduit means for transmitting the emitted light in a first direction, and light directing means for receiving the emitted light and directing the emitted light in a second direction different than the first direction. The light directing means could be reflective or refractive.

The present invention additionally provides an improved communication system employing electro-optical devices. The communications system includes an integrated structure including light transmissive conduit means and a plurality of active elements distributed adjacent to and integrally formed with the conduit means. At least one of the elements is adapted to project light signals within the conduit means in response to electrical signals applied thereto, and at least another one of the elements is adapted to detect said light signals within said conduit means.

The present invention still further provides an improved integrated thin film circuit structure including at least two generally planar layers of semiconductor devices and shielding means for magnetically isolating each planar layer of semiconductor devices from the other planar layers of semiconductor devices. The shielding means can alternatively or in addition be adapted to electrically isolate each planar layer from the other planar layers.

The invention still further provides an integrated thin film circuit structure including a plurality of planar layers of semiconductor materials forming a plurality of device planes, wherein each device plane includes a plurality of signal senders and receivers, wherein the senders are arranged to transmit signals to receivers of other ones of the planes, and wherein the signals are of a given form of radiation. The circuit structure further includes shielding means for shielding the receivers from essentially all other forms of signal radiation except the given form of radiation. Preferably, the given form of radiation is light. The senders can be further arranged to send local signals to receivers within their own plane. The local signals can be in the form of a given form of radiation, such as light, or in the form of electric current with selected ones of the senders being electrically coupled to selected ones of the receivers within a common plane.

The light generating means of the electro-optical device or the integrated thin film circuit structures can comprise light-emitting transistors, such as DIFETs or alternatively, light-emitting diodes. The light-detecting means can comprise photodiodes, photoresistors, or phototransistors, such as DIFETs.

BRIEF DESCRIPTION OF THE DRAWINGS

FIG. 1E is an alternative embodiment of an opto-isolator device of the present invention having two p-i-n diodes and a pair of reflection layers and an anti-reflection layer;

FIG. 1F is an alternative embodiment of an opto-isolator device having two thin film p-i-n diodes which share a common electrode; and FIG. 1G is a schematic diagram of the FIG. 1F device;

FIG. 10D is a plan view of a partially formed integrated circuit structure for implementing the two channel device of FIG. 10A; and FIG. 10E is a cross-sectional side view of the two DIFETs associated with channel 1, which are horizontally arranged with respect to one another;

FIGS. 13B and 13C are a partial cross-sectional view and a partial cross sectional end view and partial cross-sectional side view of another light-emitting DIFET of the present invention, which has an angle refracting optical layer for transmitting light in a generally vertical direction; wherein FIG. 13C is taken alon lines 13C—13C of FIG. 13B;

FIG. 16A is a highly simplified perspective view showing two spaced apart three dimensional integrated circuit structures, each having a plurality of devices abutting the ends of each layer, at least one of which being a DIFET laser, and at least one or more others being photoresponsive devices;

FIG. 16B is a highly simplified elargement of the outlined rectangle in FIG. 16A, which shows that many photoresponsive devices may be used to detect incoming laser light from the other structure; and FIG. 17 is a highly simplified view of yet another embodiment of the present invention showing optical communication between distinct circuit boards using DIFET laser light transmitted through an optical fiber to an optical receiver.

DETAILED DESCRIPTION OF THE DRAWINGS

Figure 1A:
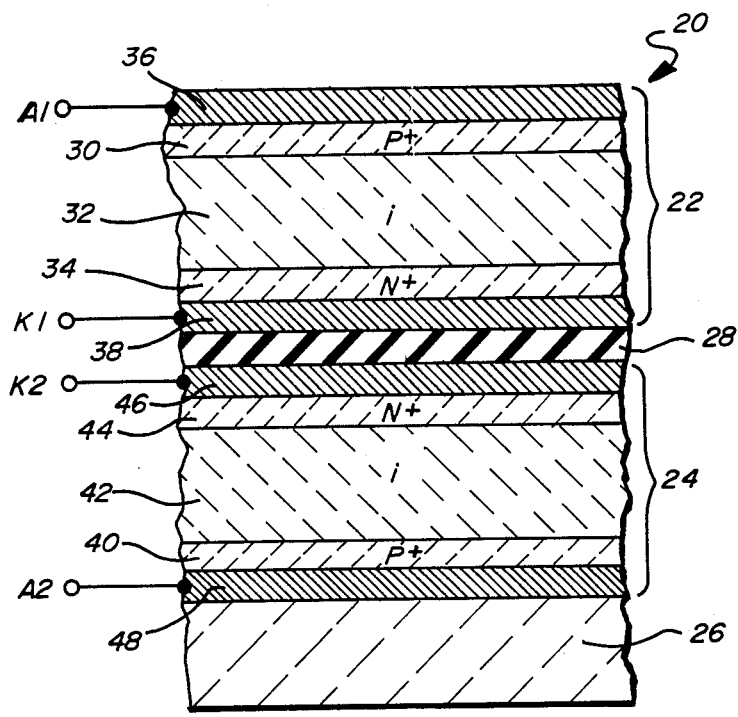
FIG. 1A is a fragmentary cross-sectional view of an electro-optical device which may be used as an opto-isolator comprised of two thin film p-i-n diodes arranged one above the other and separated by an insulating layer.
Figure 1B:
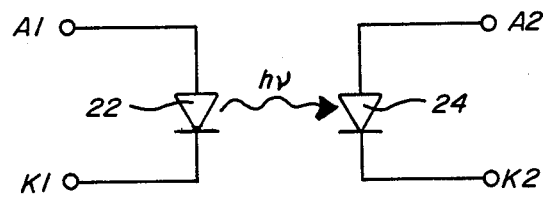
FIG. 1B is a schematic diagram of the FIG. 1A device.

Referring now to the drawings, and particularly to FIG. 1, a electro-optical device 20 formed of a pair of photovoltaic devices 22 and 24 formed on top of a substrate 26. The devices 22 and 24 are separated by an insulating layer 28. The device 22, which operates as a photo-emitter, is constructed as a p-i-n semiconductor diode comprised of $p^+$ layer 30, intrinsic layer 32 and $n^+$ layer 34. The device 22 also includes top and bottom electrodes 36 and 38, which for convenience may be called the anode A1 and cathode K1 of the device. The device 24, which operates as a photo-receiver, is constructed as a semiconductor diode and includes an $p^+$ layer 40, and intrinsic layer 42, and a $n^+$ layer 44. The device 24 also includes current carrying electrodes 46 and 48, which for convenience may be called the anode A2 and cathode K2. The equivalent circuit of the electro-optical device 20 is shown in FIG. 1B. As indicated in FIG. 1B, photons of light (hv) emitted by the photo-emitter diode 22 are detected by photo-responsive diode 24.

The substrate 26 may be formed of a metallic material, such as thin stainless steel or aluminum, or it may be formed of a thin electroformed member, such as nickel. If an insulated substrate is desired, a thin insulating material may be deposited over a conductive substrate. Alternatively, the substrate 26 may be formed from an insulating material such as glass or synthetic polymers.

Each of the devices 22 and 24 may be fabricated with an amorphous semiconductor body containing at least a silicon or germanium alloy. The intrinsic semiconductor layers 32 and 34 may be lightly doped in accordance with the teachings of U.S. Pat. No. 4,555,568 entitled Photovoltaic Device Having Long Term Energy Conversion Stablility And Method Of Producing Same, which issued in the names of S. Guha and W. DenBoer on Nov. 26, 1985. This patent teaches how to produce a photovoltaic device which may have its photo induced defects annealed out of the photoactive region thereof in a low temperature process.

The insulating layer 28 may be any transparent non-conductive material that is compatible with the materials to which it is adjacent, such as silicon oxide ($S_XO_Y$) or a silicon nitride ($S_XN_Y$). The current-carrying electrodes 38 and 44 of devices 22 and 24 respectively are a transparent conductive material (TCO), such as indium tin oxide or tin oxide, which will make ohmic contact with the adjacent n+ layers 34 and 44. To avoid having the tin oxide contaminate the n+ layer, a very thin layer of chrome or molybdenum (not shown) may be placed directly below and above the tin oxide. The outer electrodes 36 and 48 of devices 22 and 24 respectively may be formed of either a transparent or opaque conductive material, preferably a metal such as chrome, molybdenum or tantalum, which will make ohmic contact with p+ layers 30 and 40.

As disclosed in U.S. Pat. No. 4,342,044 entitled Method For Optimizing Photoresponsive Amorphous Alloys And Devices which issued in the names of S. R. Ovshinsky and M. Izu on July 27, 1982, is assigned to the assignee of the present invention, and is hereby incorporated by reference, the photo-active regions 32 and 42 of devices 22 and 24 respectively may be modified by adding one or more band gap adjusting elements. In this manner, a selected optimum wavelength threshold for the application wherein the devices to be used in order to increase the photo absorption efficiency, thereby enhancing the photoresponse of the device, without adding states in the gap which decrease the efficiency of the devices.

In operation, the electro-optical device 20 of FIG. 1A has a suitable voltage and current applied across the electrodes A1 and K1 of photo-emitter device 22, thereby emitting light which is detected by the photoresponsive device 24. Device 22 will emit light when driven hard enough, i.e., when holes from the p+ layer 30 and electrons from the n+ layer 34 are injected into intrinsic layer 32 in sufficient quantities to largely fill the defect states or traps present within the intrinsic material, which enables enough holes to enter the valance band and enough electrons to enter the conduction band within the bulk of layer 32, to permit a siginificant portion of the holes and electrons radiatively recombine, emitting photons of light in random directions. Radiative recombination of electron-hole pairs in amorphous silicon alloys is a phenomenon that has been known for at least several years to those in the art.

Some the the photons created in layer 22 toward the photoresponsive device 24, which acts as a receiver through transparent layers 38, 46 and 44. A number of these photons strike atoms within the bulk intrinsic layer 42 of receiver 24, causing electron-hole generation, which can be detected, provided that electron-hole pairs are created at a sufficient rate, as will be explained shortly.

One mode of operating device 24 is to use it as a photovoltaic cell and detect the voltage it produces in response to photons from device 22. A detectable voltage will be generated across the photoresponsive device 24 when the rate at which photons bombard photoactive layer 42 is sufficiently high. Under such conditions the p+ layer 40 and its associated metal ohmic contact layer 48 will become negatively charged and the n+ layer 44 and its electrode 46 will become positively charged, thereby producing a voltage which can be sensed by other electrical circuits (not shown) connected to anode A2 and cathode K2.

Another mode of operating the FIG. 1A device is to supply a voltage across the current-carrying electrodes 46 and 48 of device 24. This mode works best when layer 42 is sufficiently depleted such that only the reverse leakage current flows. To ensure that device 24 is sufficiently depleted, a bias voltage of approximately 5 volts to 10 volts (or more) may be applied across anode A2 and cathode K2. When no photons, or only an insignificant number of photons, are traveling across intrinsic region 42, the resistivity of layer 42 will be high, on the order of $10^5$ ohm-centimeters or more. When a substantial number of photons fall upon layer 42, the resistivity of layer 42 will dramatically decrease due to electron/hole generation. This effect may be explained qualitatively as follows. When an electron-hole pair is generated by a photon in layer 42, the hole and electron will travel to opposite electrodes, thus representing a minute current equivalent to one electron/hole traversing the layer 42. By pulsing the current through photoemitter 22, data can be optically transmitted across insulating layer 28 and optically received by photo receiver 24 and be detected thereby suitable electrical means as described above.

Figure 1D:
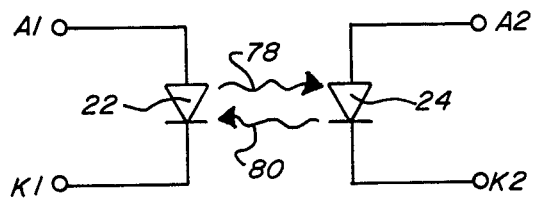
FIG. 1D is a schematic diagram of another electro-optical device having two pin diodes having bidirectional communication capabilities.
Figure 1H:
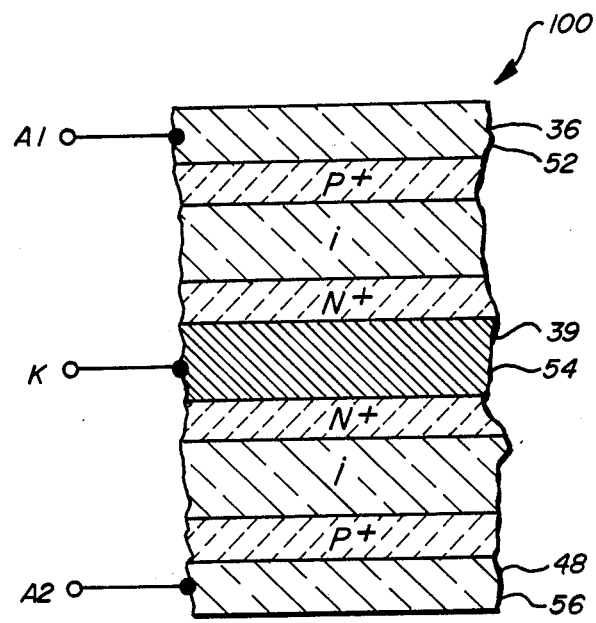
FIG. 1H is an alternative embodiment of the FIG. 1F device having two reflection layers and an anti-reflection layer.
Figure 1C:
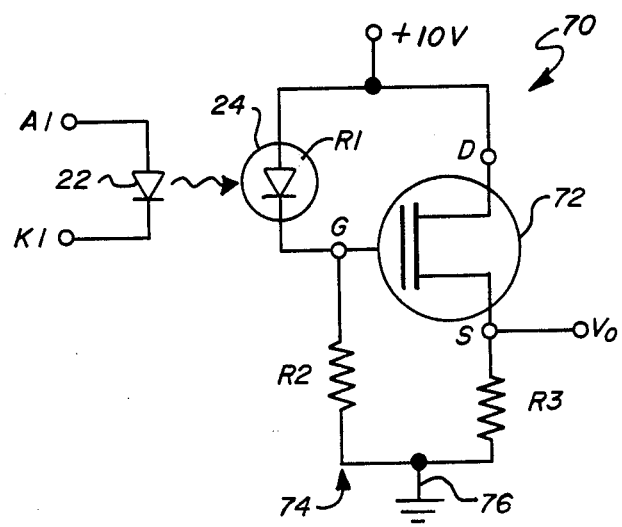
FIG. 1C is an electrical circuit diagram showing one possible receiver circuit for producing a usable output voltage from the photovoltaic diode of the FIG. 1A device.

FIG. 1C shows a suitable circuit for detecting the changes in photoconductivity of device 24. Circuit 70 may be implemented using all thin film devices. Circuit 70 includes an n-type depletion mode field effect transistor (FET) 72, a voltage divider network 74 comprised of photoresponsive device 24 (labeled R1), and a resistor R2, and a load resistor R3 connected as shown between a voltage source $V_{CC}$ which may be 10 volts, and DC, common, indicated as ground 76. The value of resistor R2 is selected to be relatively large with respect to the dark resistivity of device 24 and relatively small with respect to the light resistivity of device 24. As used herein, dark and light resistivities refer to the resistivities of a photoresponsive device under conditions of total darkness and its average expected illumination respectively. Thus, when photo-sensor 24 is not receiving any photons from photo-emitter 22, the voltage on the gate G of FET 72 will be near zero volts, and when the photo-sensor 24 is receiving sufficient quantities of photons from device 22, the gate G of FET 72 will be near the $V_{CC}$ voltage. Accordingly, output voltage $V_0$ will be approximately zero volts when no photons are being detected by photo-sensor 24, and will be near $V_{CC}$ volts when a sufficient quantity of photons are being detected by photo-sensor 24.

Those in the art will appreciate that the device of FIG. 1A provides electrical isolation between the circuit connected to photo-emitter 22 and the detecting circuit connected to photo-sensor 24, and thus may be used as an opto-isolator.

FIG. 1D schematically illustrates another aspect of the present invention. If appropriately constructed, and connected to a suitable driving circuit, device 24 could be made to detect the photon radiation from device 22 indicated by wavy arrow 78, and emit photon energy, indicated by wavy arrow 80. Similarly, if device 22 were appropriately constructed and driven, it could be made to receive photon energy 80 as well as emit photon energy 78. In this embodiment of the present invention, devices 22 and 24 may, if desired, have the same geometries.

FIG. 1E shows an alternate version of the FIG. 1A embodiment of the present invention having three additional layers 52, 54 and 56 which may be used to enhance the performance of the FIG. 1A device. The FIG. 1E device is identical to the FIG. 1A device, except for the three additional layers. The first additional layer 52 is a reflection layer which helps reflect photons generated by layer 32 that are travelling generally toward electrode 36 back towards the receiver device 24. The second additional layer 54 is an anti-reflection layer which helps prevent photons which have entered device 24 from bouncing off of the various surfaces therein and travelling back into the device 22 where they might be uselessly absorbed. The third additional layer 56 is also a reflection layer, and substantially prevents photons from escaping from device 24 into substrate 26. Layers 52, 54 and 56 all help improve the efficiency with which the electro-optical device 20 operates thereby allowing lower voltages to be used. Additional details about how to construct an antireflection layer are disclosed in U.S. Pat. No. 4,555,586 issued Nov. 26, 1985 and need not be discussed here.

The reflection layers may be made out of magnesium chloride or indium tin oxide, or any other suitable material known to those in the art.

The thickness of semiconductor layers 30, 34, 40 and 44 may range from 200 angstroms to 500 angstroms or more. The materials chosen for the layers between layers 32 and 42 must each be largely optically transparent for the wavelengths of interest. However, layers 34, 38, 28, 46 and 44 must not individually or collectively be so thick as to block too many photons from layer 22 from reaching layer 42. Subject to the foregoing restraints, the electrode layers 36, 38, 40 and 48 may be made of any material which makes ohmic contact with the adjacent doped semiconductor layer. Alternatively, highly conducting microcrystalline or polycrystalline semiconductor materials may be used instead of metal or metal alloys for these electrode layers. The materials chosen for electrode layers 38 and 44 may be identical since layers 34 and 44 each touch n+-type semiconductor material. Similarly, the materials chosen for electrode layers 36 and 48 may be identical since each of these electrode layers touch p+-type material. Those skilled in the art should appreciate that the arrangement of the diodes in the FIG. 1 device may be reversed. For example, the diodes may be turned around so that the p+ layers are closest to the center layer 28, while the p+ layers are FIG. 1F shows another embodiment of the present invention wherein its devices 22 and 24 share common cathode electrode 39. This embodiment is identical in all respects to the FIG. 1A embodiment discussed above, except for the absence of metal electrode layers 38 and 46 and insulating layer 28. The schematic diagram for this circuit is given in FIG. 1G. There are several advantages to this construction, including the use of less layers, and the resultant reduction of the number of layers and the thickness of the total material through which the photons generated in intrinsic 32 must travel in order to reach the intrinsic layer 42. This allows a greater number of photons generated by layer 32 to travel from layer 32 to layer 42 so that device 22 need not be driven as hard as in the FIG. 1A embodiment. The embodiment of FIG. 1C may, if desired, be provided with reflection layers 52 and 56 on the outer side of devices 22 and 24 respectively. An antireflection layer 54 may also be added in the manner shown in FIG. 1A. If the antireflection layer is made out of a material which would make ohmic contact with an n+-type semiconductor, then it may also simultaneously serve as the common electrode between the two n+ layers 34 and 44. A suitable material for this purpose would be indium tin oxide.

One distinct advantage of utilizing a insulating layer between the devices 22 and 24 is that it assures that the input circuit which drives device 22 is electrically separated from the output circuit to which device 24 is connected. Conventional discrete opto-isolators, such as a discrete photo diode and photo-sensitive transistor, are kept electrically isolated from one another to prevent electrical cross-talk between the input and output circuits.

However, it is possible, as the device of FIG. 1F illustrates, to construct an integrated opto-isolator device which shares a common electrode. This is advantageous in terms of reducing the number of layers required for the device. In thin film integrated structures, this technique can prove very advantageous to provide electrical and/or magnetic shielding between adjacent layers of circuits which are vertically arranged. In particular, a continuous unbroken layer of transparent metal may be used, if desired, as the grounded conductor for circuits on the two adjacent layers in a three dimensional integrated structure. Also, such a metallic layer would serve as a "ground" plane which would stop virtually all electro-magnetic induction (EMI), radio frequency interference (RFI) and electro-static discharge (ESD) between the circuit of the two different levels. Moreover, it would provide a highly efficient (that is, very low resistance) grounded conductor to which other circuit devices in the integrated electronic structure could be readily connected. Alternatively it could serve as a grounding conductor to provide an extremely low resistance secondary path to ground for those circuits which might require or advantageously use the same.

FIG. 1H shows an electro-optical device 100 which is similar in construction to device 80 in FIG. 1D, except that layers 36, 48 and 39 have had their thickness adjusted so as to provide a pair of reflection layers and an anti-reflection layer respectively. This reduces the number of processing steps and number of different materials that would otherwise be required to achieve the same result.

Figure 2A:
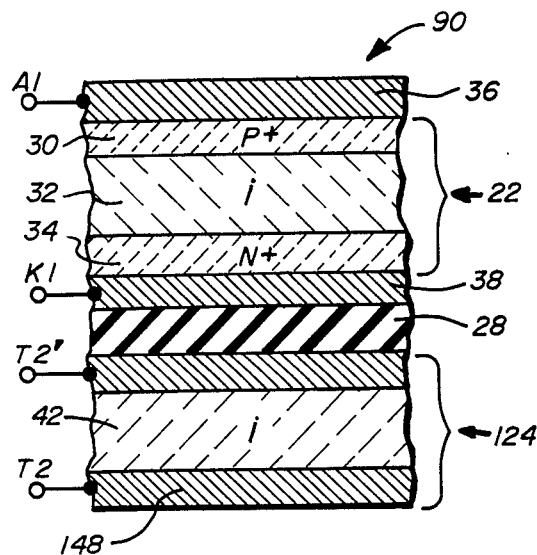
FIG. 2A is another electro-optical device of the present invention useful as an opto-isolator and having a p-i-n diode and a photoresistor vertically arranged.

FIG. 2A shows an embodiment of the present invention even simpler in construction than the embodiment of FIG. 1. Like the FIG. 1 devices, the FIG. 2 device 120 employs a photo-emitting device, which may be identical in construction to device 22 shown in FIG. 1, and a photo-responsive device 124, which is similar to, but simpler than, the photo-responsive device 24 in FIG. 1. The photo-responsive device 124 is comprised of a semiconductor layer 42 and electrode layers on either side thereof. The electrode layers 46 and 48 may be made of a metal or metal alloy which makes ohmic contact with the intrinsic layer 42. Suitable metals include aluminum, tantalum, chrome, and molybdenum.

Figure 2B:
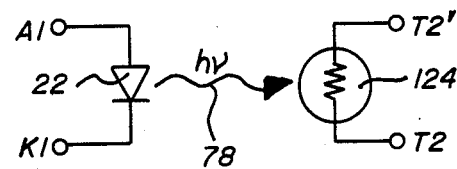
FIG. 2B is a schematic diagram of the FIG. 2A device.

FIG. 2B is a schematic diagram of the FIG. 2A device, and it shows photon energy 78 from device 22 headed toward photo-resistor 124.

Figure 2C:
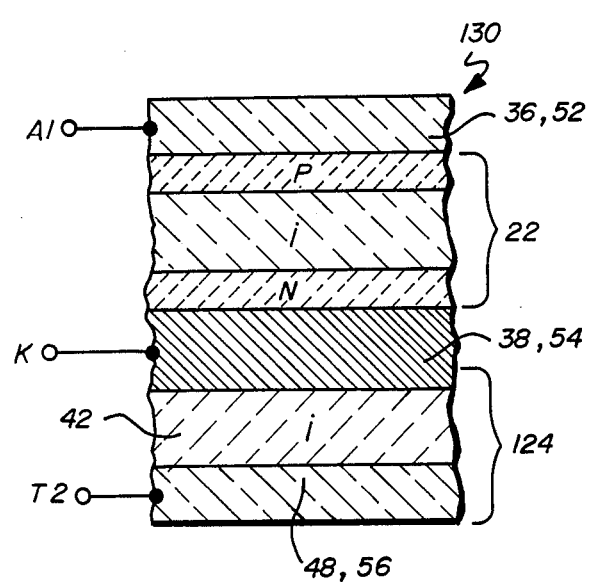
FIG. 2C is another embodiment having a p-i-n diode and a photoresistor which share common electrode.
Figure 2D:
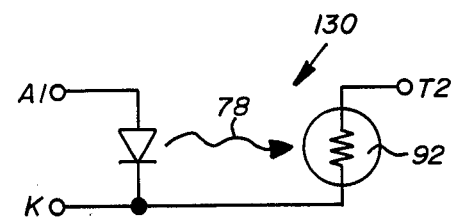
FIG. 2D is its schematic diagram.

The device 130 in FIG. 2C is an alternate embodiment of the device 120 shown in FIG. 2A. Device 130 has a photo-emitter 22 and a photo-resistor 124 which share a common terminal contact K, which for convenience will be called the cathode K. FIG. 2D is a schematic diagram from the FIG. 2C device. The top electrode layer 36 may also serve as a reflection layer 52 if it is made of the proper material and has the proper thickness. A suitable material would be molybdenum and a suitable thickness would be 2,000 angstroms. Similarly, the bottom electrode A2 may be formed of a layer which serves as the ohmic contact layer 48 and the reflecting layer 56 simultaneously. The common cathode K may also be formed of a suitable material and of a suitable thickness to act, not only as a common electrode layer which makes ohmic contact with both the n+ layer and the i layer, but also serves as the anti-reflection layer 54. Those in the art will appreciate that the use of a single layer for more than one purpose simplifies the construction of the device since it reduces the number of processing steps required to fabricate the device. Also, since the common cathode layer serves as an anti-reflection layer and as the electrode layers, it is thinner than these layers would be if made separately. Hence, a larger number of photons from device 22 will find their way to intrinsic layer 42 within device 124.

Figure 2E:
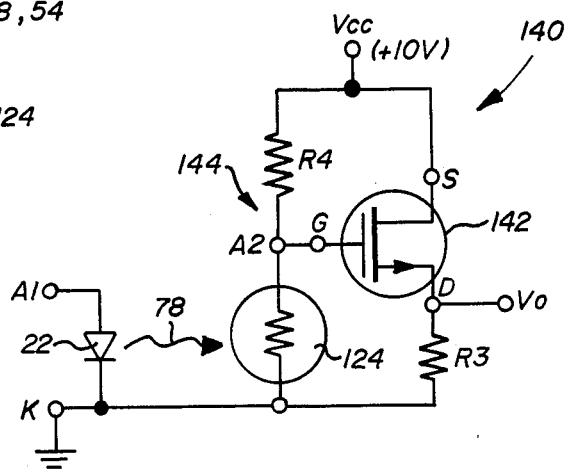
FIG. 2E is an electrical circuit diagram showing a receiver circuit useful for producing a useable output voltage from the photoresistor of the FIG. 2C device.

FIG. 2E is a schematic diagram of a circuit 140 which may be used to detect the changes in resistivity of photoresistor 124 when photons 78 emitted from photo-emitter 22. Circuit 140 includes a n-channel enhancement mode MOSFET 142, a load resistor R3, a voltage divider network 144 composed of resistor R4 and photoresistor 124, all connected as shown in FIG. 2E. The resistance value of resistor R4 is selected to be much smaller than the dark resistivity of photoresistor 124, and much larger than the light resistivity of photoresistor 124. Accordingly, when photons from device 22 are not detected by device 124, the gate G of FET 142 is at approximately $V_{CC}$ volts, and when device 22 is emitting large quantities of photons, the voltage at gate G is near 0 volts when gate G is near $V_{CC}$ volts. The FET 142 is on and substantial current flows from its source to drain. When gate G of FET 142 is near 0 volts, the FET is off, thus allowing the output $V_O$ to approach $V_{CC}$ volts.

Figure 3A:
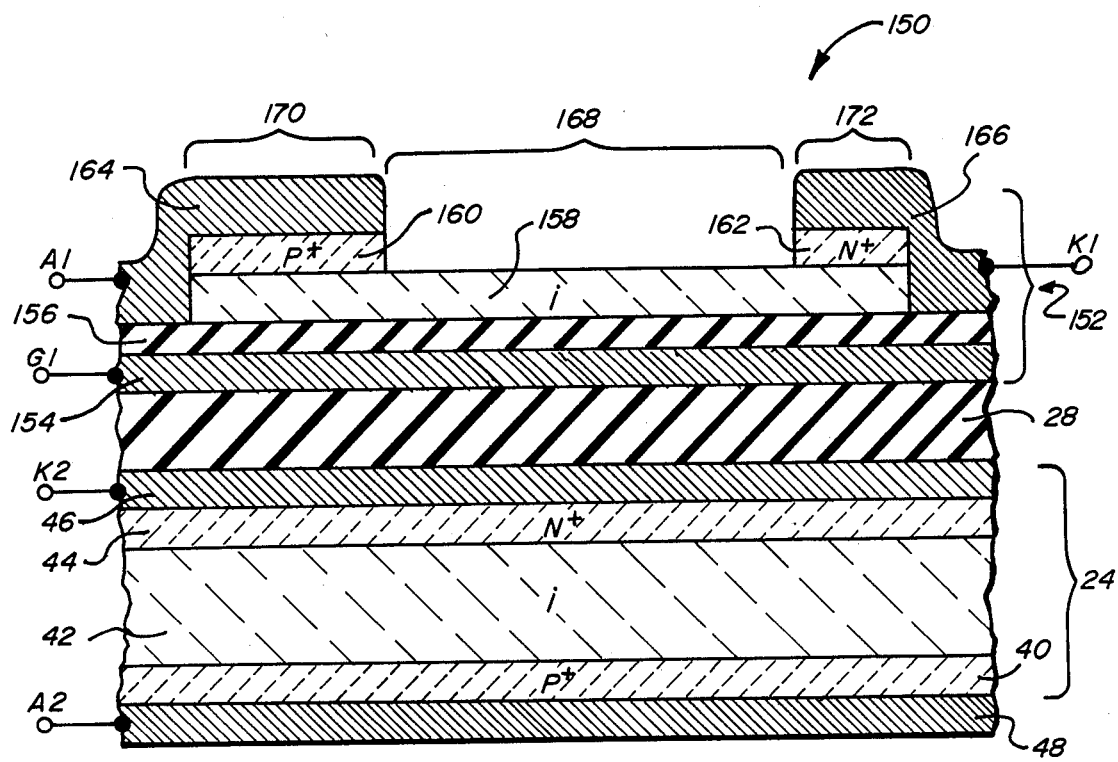
FIG. 3A is another electro-optical device of the present invention having a double injection field effect transistor (DIFET) and a photodiode vertically arranged as an integrated structure.

FIG. 3A shows a electro-optical device 150 of the present invention having a third transistor 152 and a photodiode 24 separated by a layer of transparent insulating material 28. The device 24 which may be constructed upon a substrate (not shown) may be made identical to photoreceiver 24 in the FIG. 1A device. The photo-emitting transistor in FIG. 3A may preferably take the form of a double injection field effect transistor (DIFET) described in U.S. patent application, Ser. No. 788,594, which has been previously mentioned. Although details of how to construct several different embodiments of a light-emitting DIFET are given therein, it will be sufficient for our present purposes to refer to representative DIFET 152. The operation and construction of DIFET 152 will now be briefly described.

Transistor 152, which is horizontally arranged, can be formed by thin film deposition techniques of the type described above with respect to the photovoltaic cells or diodes 22 and 24 in the FIG. 1A device. Transistor 152 is comprised of a conductive gate layer 154, a gate insulator layer 156 and an active semiconductor layer 158, a semiconductor region 160 doped with p-type dopants, a semiconductor region or layer 162 doped with n-type dopants, a conductive electrode 164 which makes ohmic contact with the p+ layer 160, a conductive electrode 166 which makes ohmic contact with the n+ layer 162. The p+ layer 160 and its conductive layer 164 may be called the anode of DIFET 152, and the n+ layer 162 and its electrode 166 may be called the cathode of DIFET 152. The active semiconductor layer 158 may be lightly doped with p-type or n-type dopants, or it may be an intrinsic layer with only extremely small levels of dopants or no dopants at all. When DIFET 152 is made from amorphous silicon materials, layers 158, 160 and 162 are preferably hydrogenated and/or fluorinated in order to reduce the density of states within the layers, particularly intrinsic layer 158.

In horizontal DIFETs of type depicted by DIFET 152, the channel layer 158 is preferably 200 to 10,000 angstroms thick, the doped layers 160 and 162 are preferably 100 to 500 angstroms thick, the metal contact layers 164 and 166 are preferably 500 to 3,000 angstroms thick, the insulating layer 156 is preferably 200 to 5,000 angstroms thick, and the gate layer 154 is preferably 500 to 3,000 angstroms thick.

In operation, transistor 152 is preferably operated in the enhancement mode, particularly when it is made of materials having a relatively low electron and/or hole mobility such as amorphous silicon alloy. The channel is preferably substantially non-conducting in the absence of the application of a voltage to gate 154 that induces charge carriers of a dominant polarity into the channel region 168 of the active layer 158, even though an electric potential is applied between the anode A1 and cathode K1 of transistor 152. When a suitable voltage is applied to gate 50, dominant carriers will be drawn from within the intrinsic layer 156 and from the current-carrying electrode which readily injects such carriers toward the insulated gate (composed of layer 154 and gate insulator 156), and will tend to accumulate predominantly in the layer 158 adjacent to the insulating layer 156, and will form a conduction channel therein. For example, if the layer 158 is made of intrinsic hydrogenated amorphous silicon alloy, and a positive voltage is applied to gate 154, an excess of electrons will be drawn toward the gate, from a conduction channel, as in a conventional, horizontally formed n-channel MOSFET. However, unlike a conventional insulated gate FET (IGFET), which has substantially only charge carriers of one polarity, the transistor 152 is ambipolar, that is, allows charge carriers of both types to enter into the active layer 158. In a DIFET, as dominant carriers are drawn into layer 158 and form a conduction channel, charge carriers of the opposite polarity, called the compensating charge carriers, are drawn from the current-carrying electrodes having a dopant-type opposite from that of the electrode supplying the dominant or majority charge carriers. The compensating charge carriers tend to greatly neutralize the space-charge created by the primary carriers from the other electrode, thus greatly reducing the self-screening effect of the dominant charge carriers which have been drawn into the conduction channel formed in layer 158 by the applied gate field. Accordingly, the gate induced field is able to project further into the depth of the intrinsic layer, and the density of both types of charge carriers increases dramatically. Amorphous materials typically have many defect states which act to trap charge carriers of either or both polarities whenever a electric field is applied across the material, thus limiting the amount of current which may flow. Since a DIFET has a greatly increased number of electrons and holes in the active region of the device, however, a substantial percentage of the traps in the intrinsic layer 158 made of amorphous material are filled, thus allowing a substantial number of free carriers, i.e., electrons in the conduction band and holes in the valance band, to contribute to the channel current. As the number of holes and electrons in the channel region become nearly equal, the space charge created by the carriers in the channel is substantially neutralized, thus allowing even higher currents to flow. Higher currents push the quasi-Fermi levels of the electrons closer to the conduction band, and also push the quasi-Fermi levels of the holes closer to the valance band. It also fills an even larger number of traps or defect states present in the layer 158. Thus, radiative recombination between electrons in or very near the valance band and holes in or very near the conduction band will occur. Therefore, the transistor 152 will exhibit electro-luminescence. The wavelength of this electro-luminescence (photon emission) can be altered by alloying the material of layer 158 so as to vary the band gap. The band gap for amorphous silicon alloys, for example, are about 1.7 eV, which corresponds to the wavelengths in the deep red range of electromagnetic spectrum. As previously noted, the band gap may be widened with silicon alloys containing elements such as carbon, nitrogen or oxygen, or reduced with silicon alloy containing elements such as germanium, tin or boron.

In light of the foregoing comments regarding DIFET 152, those in the art will appreciate that DIFET 152 acts as a light emission device in the same general manner that a conventional of the gallium arsenide type LED does.

To achieve maximum current, and thus maximum light emission, from the DIFETs, it is highly desirable to adjust the densities of dominant and compensating charge carriers in the active layer 158, especially in the conduction channel, so as to achieve optimimal space charge neutralization. Several different space charge neutralization techniques are described in U.S. patent application Ser. No. 788,594, which is incorporated by reference, and thus need not be described here beyond noting the following. In the DIFET 152 shown in FIG. 3A, the p+ and n+ electrodes have been sized differently to assist in achievement of optimized space charge neutraliziation by matching the effective areas of the two electrodes. Assuming that the DIFET 152 has been recti-linearly designed with electrodes 160 and 162 having a rectangular shape, the effective area of the p+ electrode 160 should be the amount of area in the overlap 170 between layers 158 and 160, and the effective area of the n+ electrode 162 should be the amount of overlap 172 between layers 158 and 162. For any given semiconductor material-charge injector combination forming the interface between layer 160 or 162 and layer 158, carrier injection efficiency i.e., the number of carriers per unit area at a given bias applied to the interface, can be readily determined experimentally. The effective areas of the two interfaces can then be selected so as to optimize the space charge neutralization at the desired operating voltages of the DIFET. In amorphous silicon alloys, electrons are more easily injected into an intrinsic layer, such as layer 158, than are holes. Accordingly, the effective area of p+ layer 160 is shown to be larger than the effective area of n+ layer 162 in FIG. 3A, so as to achieve optimized space charge neutralization for maximum light production during the operation of transistor 152. However, those in the art should appreciate that any technique which achieves a balance of carriers in the active layer 158 will suffice for purposes of the electro-optical devices of the present invention which employ DIFET, or any equivalent light-emitting transistor.

It has been determined that DIFETs effectively operate in what may be called a super-enhancement mode when a voltage is applied to the gate of a DIFET which attracts charge carriers and begins to establish space-charge neutralization, no matter how limited. In other words, the currents achieved in DIFETs when operated in the enhancement mode are substantially greater than that which could be achieved when the DIFET is operated as a forward biased diode (without a gate voltage being applied). Accordingly, it should be understood that a DIFET is much preferred over a simple p-i-n diode as a source of photon energy, since its currents are well in excess of those achieved by light-emitting diodes made of the same material. Hence, the embodiments of the present invention which employ DIFETs will be able to operate at lower voltages and better performance than the embodiments of the present invention employing light-emitting diodes as a photon energy source. Those in the art should also appreciate that because DIFETs are able to operate at much higher currents, they are able to operate in circuits at a much higher frequency than are light emitting diodes made of the same material, and are thus preferred for this reason as well.

Radiative recombination of electron-hole pairs produces photons which are substantially randomly directed, as in light-emitting diodes. Accordingly, if the light produced by the DIFET is intended to be received by a photosensor device, it is often desirable to direct the light emissions of the DIFET toward the intended photosensor. Various means can be used to do this, and are shown in various embodiments, such as the embodiment of FIG. 3B, which will be described shortly.

Figure 3B:
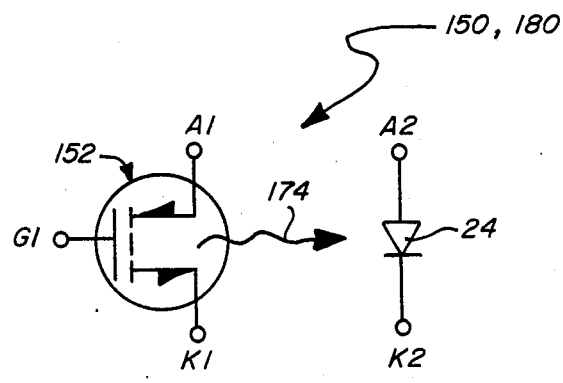
FIG. 3B is its schematic diagram.

The operation of electro-optical device 150 is diagrammatically illustrated in the equivalent circuits shown in FIG. 3B. The circuit symbol shown on the left side of FIG. 3B represents DIFET 152 whose three terminals may perspectively be called the anode A1, the cathode K1 and the gate G1. When transistor 152 is turned on, by application of suitable anode to cathode voltages (e.g., 25 volts) and gate voltages (e.g., 25 volts), light indicated by wavy arrow 174 is emitted and travels toward photo-receiver 24, where it is detected. Referring now to FIG. 3A, the light 174 is generated in the intrinsic layer 158 by radiative recombination of electron-hole pairs, and a portion of the light travels through transparent layers 156, 154, 28, 46 and 44, finally reaching photoactive region 42 of device 24.

If made thick enough, metallic electrodes 164 and 166 will block light from escaping from the left and right ends of the DIFET 152, thus effectively helping to channel more of the photons generated in layer 158 into the photodiode 24.

Figure 3C:
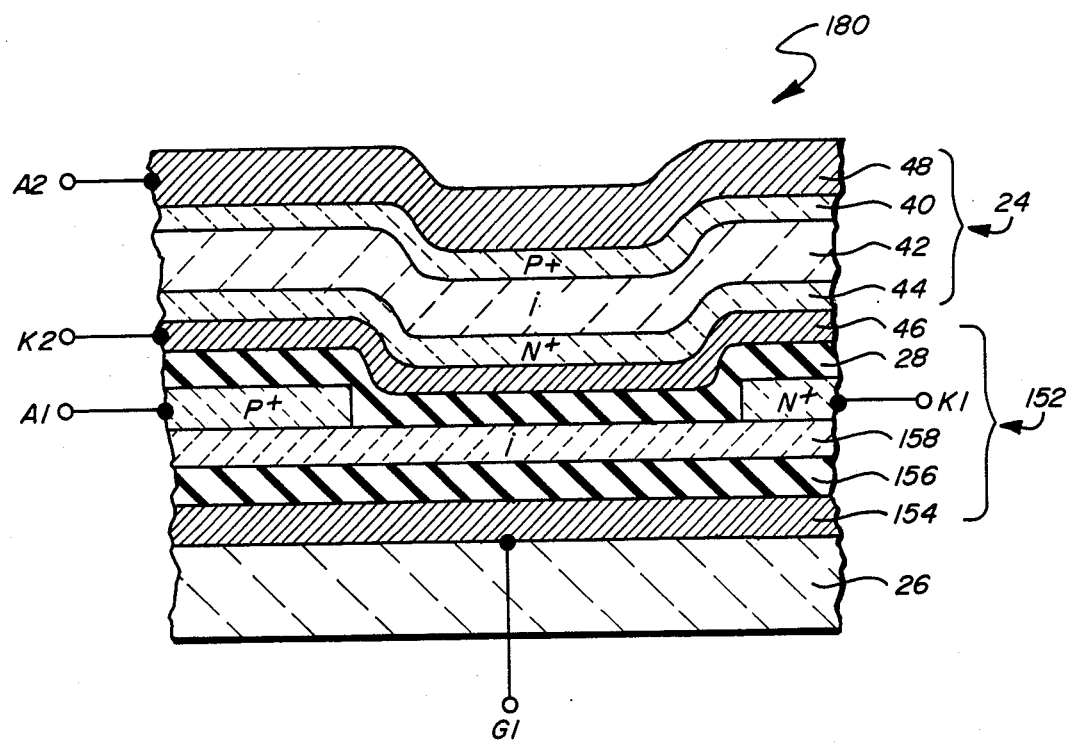
FIG. 3C is another fragmentary, cross-sectional view of an alternative embodiment of an integrated electro-optical device having a DIFET and photoresistor vertically arranged.

The electro-optical device 180 shown in FIG. 3C is similar to the device 150 illustrated in FIG. 3A, but has the location of the DIFET 152 and the photoreceiver 24 reversed. That is, the DIFET 152 constitutes the bottom element of device 180, and the p-i-n diode 24 constitutes the top element. This arrangement has at least the following advantage: the light emitted from DIFET 152 travels through fewer layers to reach the active layer of device 24 (three intervenient layers rather than five intervenient layers).

To enhance the performance of device 180, conductive layers 48 and 154 may be made of a suitable thickness to act as reflection layers, and layer 46 may be made to have a thickness which allows it to act as an antireflection layer. Those in the art will appreciate that the circuit diagram of FIG. 3B is just as applicable to the intergrated electro-optical structure FIG. 3C as it is to that of FIG. 3A.

Figure 4A:
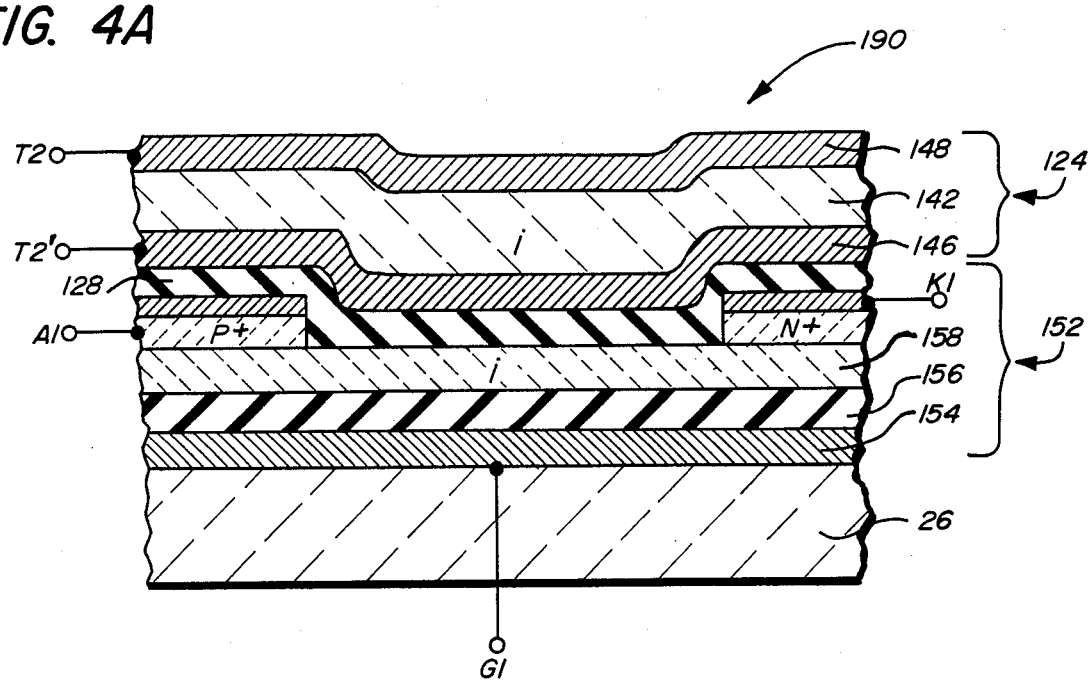
FIG. 4A is a fragmentary, cross-sectional view of another integrated electro-optical device of the present invention having a DIFET and photoresistor vertically arranged so as to minimize the number of layers through which the light from the DIFET must pass to reach the photo-active region of the photoresistor.
Figure 4B:
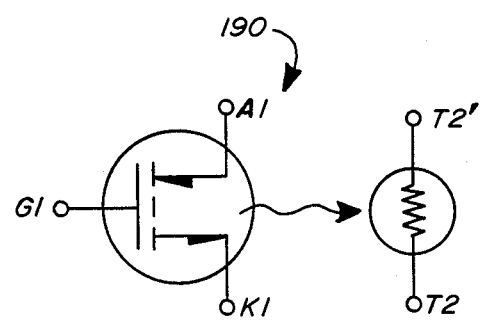
FIG. 4B is a circuit diagram.

FIG. 4A shows an integrated electro-optical device 190 which has a photo-emitting transisitor, and a photosensor 24 which is even simpler than that of FIG. 3B. Its simplicity is due to the fact that the photoreceiver is a photoresistor rather than a photodiode. The photoresistor may be constructed in the manner described with respect to the FIG. 2A embodiment, except for the fact that it is placed above insulating layer 128 in device 190 (as to below the photo-emitting element 22 in the FIG. 2A device). The use of photoresistor 124 instead of photodiode 24 saves two layers, and provides the advantage of having the light emitted from layer 158 of DIFET 152 travel through only two layers to reach the active region 142 in photoreceiver 124. As in the FIG. 2A device, the thickness of conductive layers 146 and 148 may be chosen so that these layers act as a antireflection layer and reflection layer respectively, thus enhancing the efficiency of the optical coupling between light emitter 152 and light sensor 124.

Figure 5A:
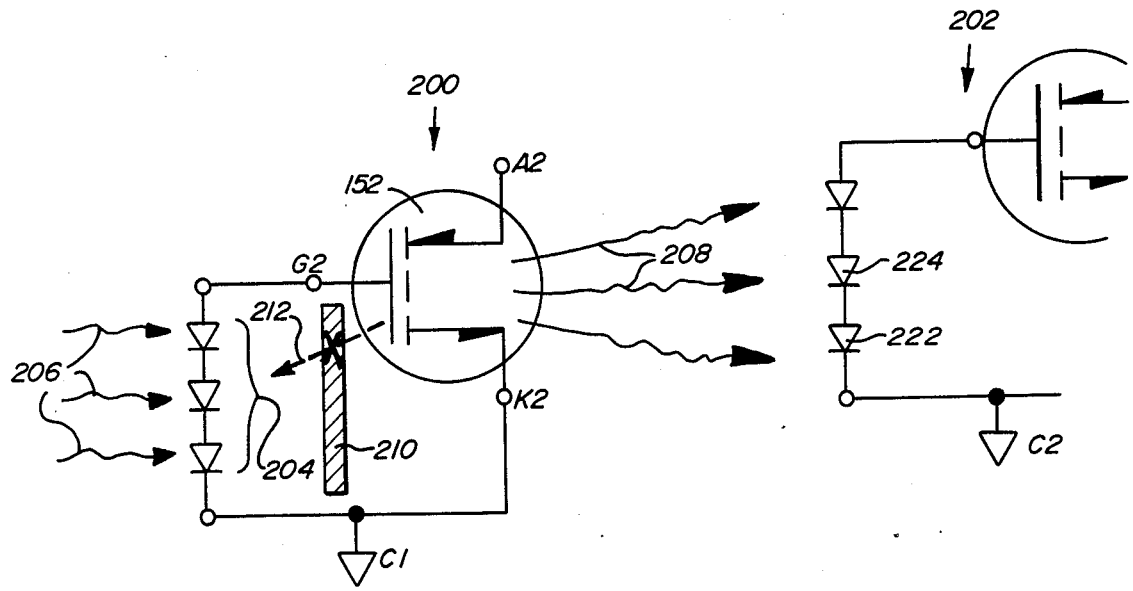
FIG. 5A is a schematic diagram of an integrated electro-optical device having a DIFET whose gate is powered by three serially arranged photodiodes, wherein the light being emitted from the DIFET is shown driving three photodiodes of a similarly constructed electro-optical device.

FIG. 5A shows in schematic form device 200 which employs a light emitting DIFET and a plurality of photovoltaic cells arranged in series-aiding relation to provide a voltage to bias the gate of transistor 152. Preferrably, transistor 152 is a DIFET. The plurality of photovoltaic cells 204 generate a voltage when illuminated by light ray 206 as illustrated in FIG. 5A. The plurality of diodes 204 may consist of more or less than three diodes arranged in series depending upon the voltage required to bias the photo-emitting transistor into conduction so as to cause transistor 152 to produce light, indicated by rays 208. Note that electro-optical device 200 could latch itself on if a sufficient amount of photon energy, represented by arrow 212 from transistor 152 were allowed to illuminate the series of photodiodes 206. In some circumstances, such a latching electro-optical device could be useful. In those circumstances where it is not, an optical barrier represented schematically by the wall 210 in FIG. 5A may be used to stop such latching action.

FIG. 5A also shows that the light 208 emitted by transistor 152 could in turn be used to drive the input circuit of another electro-optical device 202 of the same construction as device 200.

Figure 5B:
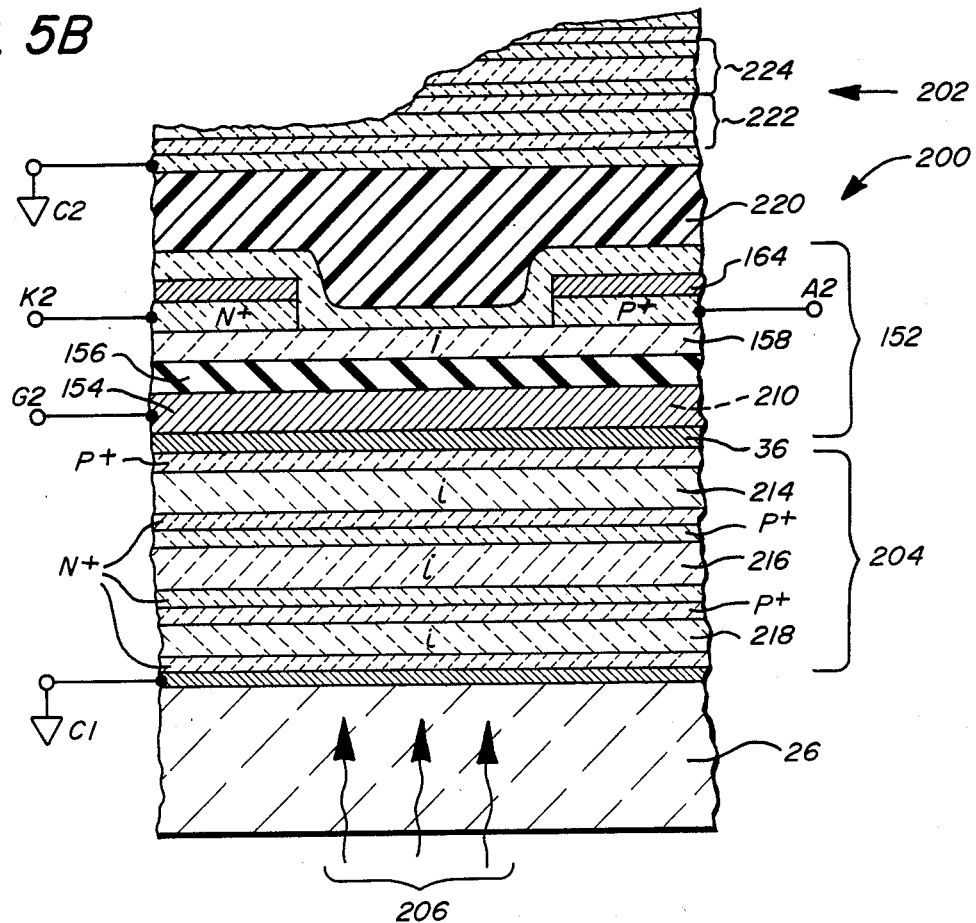
FIG. 5B is a cross-sectional view of an electro-optical device for implementing the electro-optical device shown in FIG. 5A.

FIG. 5B shows one possible horizontal and integrated embodiment for electro-optical device 200. The FIG. 5B device may be constructed upon a substrate 26 or any other suitably level layer. Photodiode array 204 includes three diodes 214, 216 and 218, which may be arranged in a series additive relationship so as to apply the cumulative voltage generated across all three devices to the gate layer G2 of DIFET 152, which is located above the diode array 204. Diodes 214 through 218 may be constructed in the same manner as photodiode 22 shown in FIG. 1A. It is preferable, however, to provide the photodiodes with slightly different band gaps in their respective active regions, which are preferably comprised of intrinsic amorphous semiconductor alloys of silicon, as is well known in the amorphous silicon photovoltaic art. FIG. 5B shows the transistor 152 as a DIFET which may be constructed in the same manner as previously described with respect to the DIFET 152 in the FIG. 3A device. Electro-optical device 200 may optionally include a substantially transparent layer of leveling material, such as polyimide, which may be purchased from the DuPont Company under the trade name "Pyralin". When applied to integrated electronic structures having an irregularly contoured surface with feature sizes on the order of several to several tens of microns, and mesa structures (hills or ridges) and vias (grooves or valleys) on the order of several microns, the leveling material can produce substantially flat planar surfaces without projections or depressions which would interfere with the placement of an additional layer directly on top of the leveling material. Accordingly, multilayer integrated electronic structures such as matrixes may be formed. Preferably, the polyimide material is applied by thin coating until uniformly distributed over the integrated circuit structure layer which is to be coated and thus levelled, and then baked at appropriate temperatures as directed by the manufacturer to sufficiently harden the material preparatory to formation of additional circuit structures on top of the leveling material. Care should be taken when using amorphous alloys of silicon and other materials which require low processing temperature (e.g., under 300° C.) to not damage the electronic devices already formed on the substrate.

FIG. 5B illustrates that electro-optical device 202 may be formed directly on top of layer 220 and above device 202 to form a vertically arranged multi-level structure having optical communications therebetween. Those skilled in the art will readily appreciate that the electro-optical devices of the present invention, such as device 200, will enable optical communications between adjacent layers in a multi-layer structure. It should also be appreciated that if the material in one or more intermediate layers were made sufficiently optically transparent, such as by selecting a insulating material like a silicon dioxide or silicon carbide with a very wide band gap, communication could be had between non-adjacent vertically arranged layers in multilayer integrated structure. The DIFET laser embodiments of the present invention direct their photon emission in a substantially vertical direction are particularly suited for such non-adjacent layer communication.

Figure 6A:
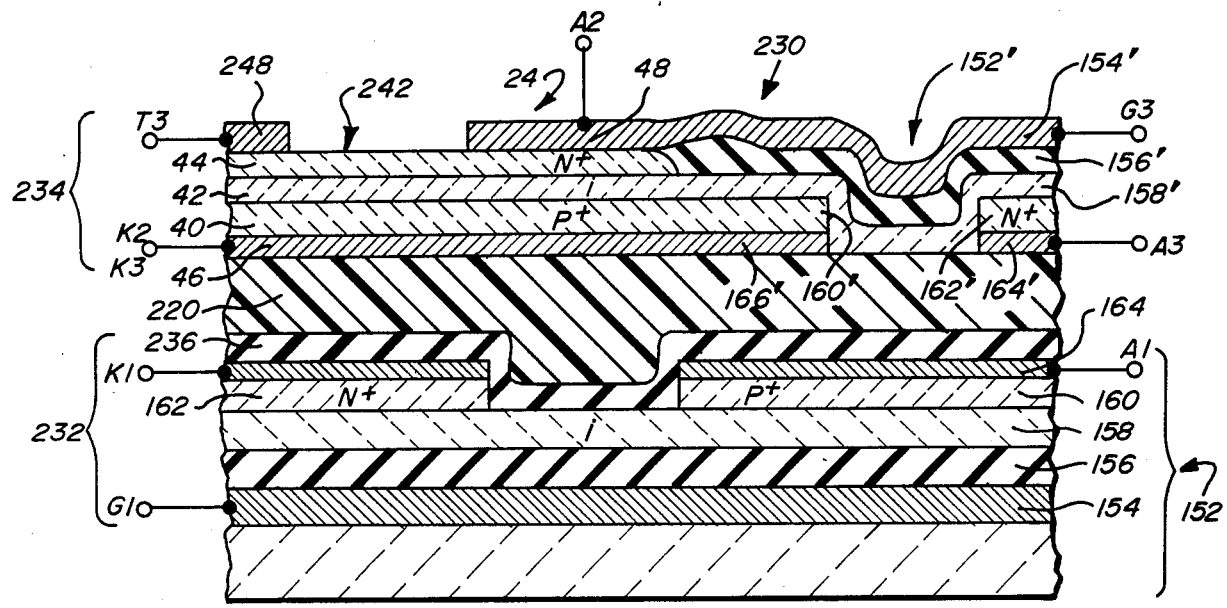
FIG. 6A is a fragmentary, cross-sectional view of yet another electro-optical device having a light emitting input section constructed from a DIFET and a light-detecting receiving section having a photodiode and DIFET.

FIG. 6A discloses an electro-optical device includes two DIFETs vertically arranged one above the other to provide electrical isolation between adjacent layers of a multilayer integrated structure while allowing optical communication between the adjacent layers. The device 230 includes a first device plane 232 and a second device plane 234 separated by a layer of optically transparent material 220 and a optically transparent insulating layer 236 located between the two device planes. If the leveling material 220 is an electrical insulator, which would typically be the case, then layer 236 may be eliminated, unless the leveling material is not chemically compatible with the adjacent device layers in planes 232 or 234. It may be preferable to deposit by evaporation or other thin film techniques one or more optically transparent layers in the location indicated by layer 236 to insure that the electronic devices formed therebelow are not subject to contamination during the handling required to apply the leveling material 220 or to provide the subjacent electronic devices with additional mechanical strength prior to the application of the leveling material.

Figure 6B:
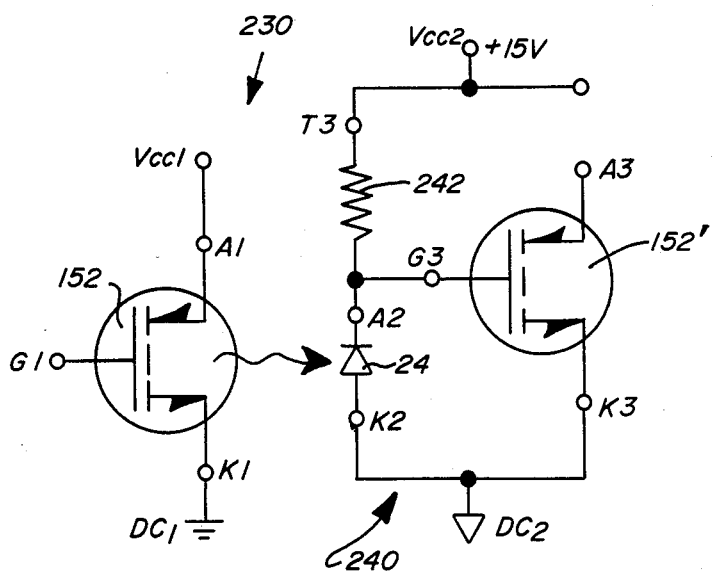
FIG. 6B is its electrical schematic diagram.

FIG. 6B schematically illustrates the circuit configuration of the device 230 in FIG. 6A and shows how the device 230 operates electronically and optically. Device 230 includes an electrical input circuit 238 and an electrical output circuit 240. The electrical input circuit 238 consists of a light-emitting transistor preferably a DIFET constructed similarly to the DIFET 152 shown in FIG. 3A. The output circuit section 240 includes a gate biasing network composed of resistor 242 and a photodiode 24, and a transistor 152' which is constructed along the lines of DIFET 152 shown in FIG. 3A. The various components of electro-optical device 230 are connected as shown in FIG. 6B. In operation, photon energy is generated when DIFET 152 is turned on, and a portion thereof is directed toward photodiode 24, substantially decreasing its resistivity, which in turn lowers the voltage applied to gate G3 to near the voltage of the positive supply $v_{cc2}$. This turns DIFET 152' off causing it to no longer act as a sink for current through its anode a3.

The various circuit components shown schematically in FIG. 6B may be readily located in the multilayer integrated circuit structure 230 shown in FIG. 6A. For example, the DIFET 152 forming the input section 238 of device 230 is located on device 232. In multilevel integrated circuit structures having multiple device planes, it is often useful to extend the layers of one device beyond the minimum boundaries required for device operation to assist in providing a relatively level structure. This has been done with layers 154 through 158 used in DIFET 152, for example.

The output section 240 of device 230 is located on the upper device plane 234. In particular, DIFET 152' is found on the right side of device plane 234 and the resistor 242 is found on the left side of this device plane. Resistor 242 is formed from n-type doped material, which as known to those skilled in the art, can be used to form integrated circuit resistors by appropriate selection of the cross sectional area and length of a stripe of such material. The terminal t3 shown in FIG. 6B is formed by metallic layer portion 248 shown in FIG. 6A and provides a convenient conductive path by which to apply the source voltage $v_{cc2}$ to resistor 242.

The diode 24 is formed of semiconductor layers 40 through 44 in device plane 234. Photodiode 24 also includes metal electrode layers 46 and 48. The same layer of metal that forms electrode 48 is used to form the gate of DIFET 152'. Note that the insulated gate of DIFET 152' is above intrinsic layer 158'. Thus, it may be seen that DIFET 152' has an inverted structure in comparison to DIFET 152. This allows various layers used to instruct DIFET 152' to also form a part of the photodiode 24, thus saving processing steps and reducing the number of layers required to fabricate the device 230.

Figure 7A:
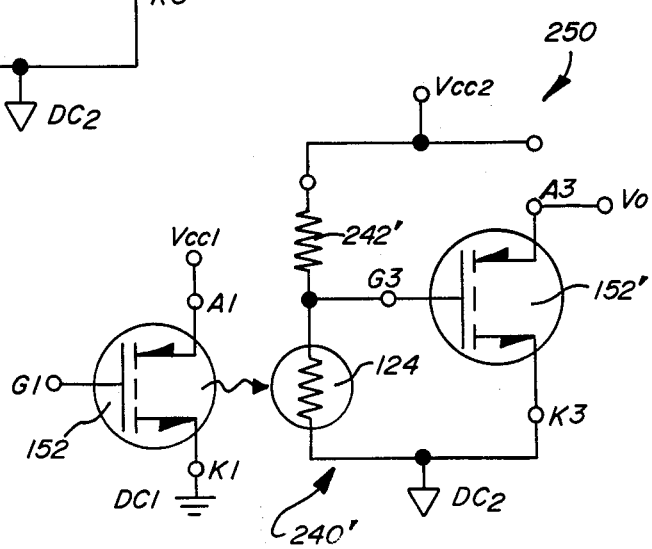
FIG. 7A is another electro-optical device similar to that of FIG. 6 except for the use of a photo-resistor in place of a photodiode.

FIG. 7A is a schematic diagram of an electro-optical device 250 which has an input section 238 and output section 240' closely resembling that shown in FIG. 6B. The only difference in the schematic diagrams is the use of a photoresistor 124 rather than the use of a photodiode 24.

Figure 7B:
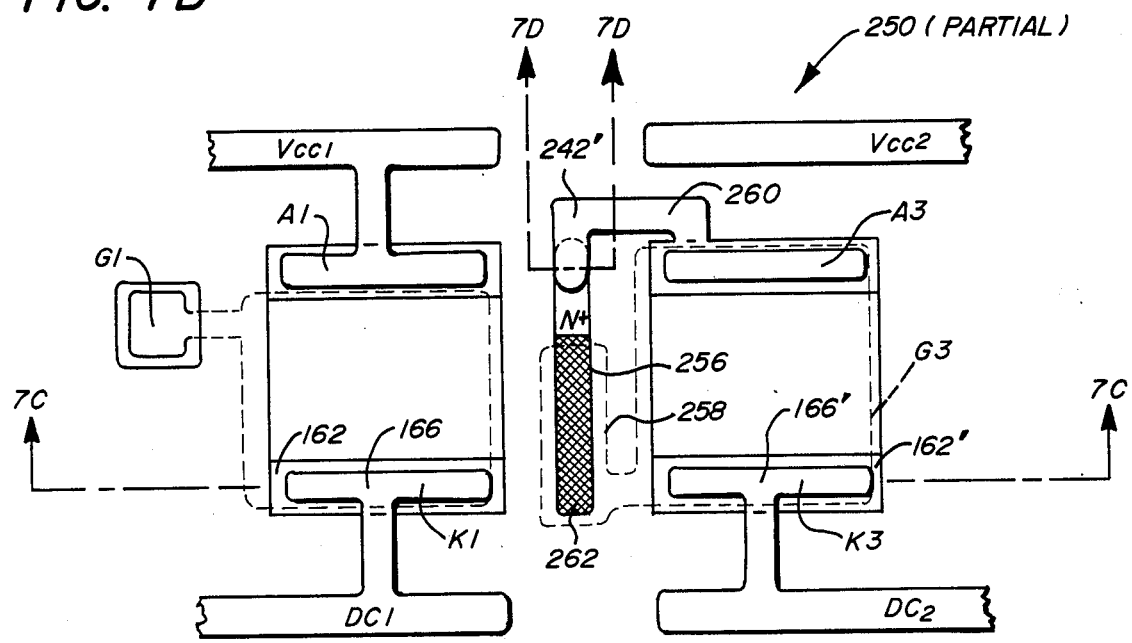
FIG. 7B is a fragmentary planned view of a partially formed integrated structure for implementing the FIG. 7A schematic diagram.
Figure 7C:
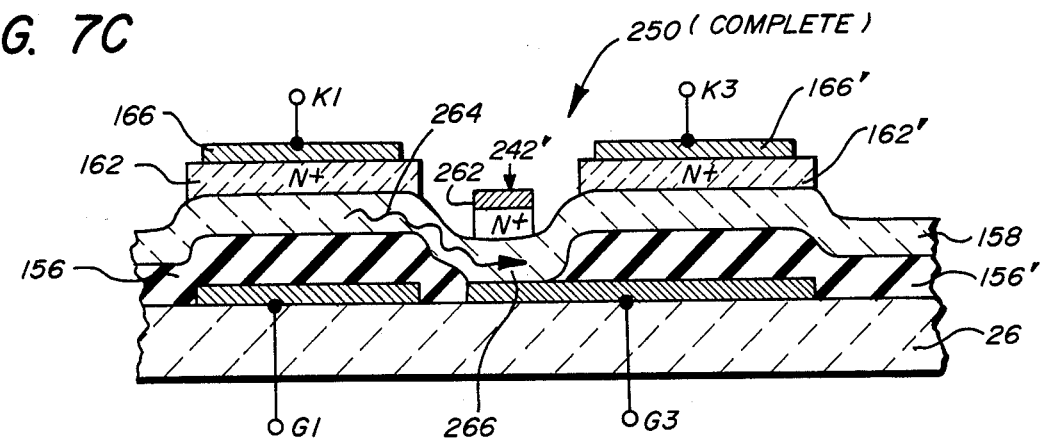
FIG. 7C is a cross-sectional view of the FIG. 7B structure taken along line 7C—7C.
Figure 7D:
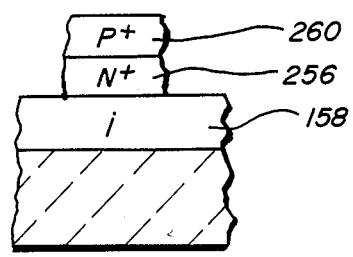
FIG. 7D is a partial cross-sectional view of the FIG. 7B structure taken along lines 7D—7D.

The electro-optical devices 230 and 250 may be implemented in either a horizontal arrangement or a vertical arrangement. One technique for a vertical arrangement for these integrated circuit structures has been shown in FIG. 6A. FIGS. 7B, 7C and 7D shown a technique that may generally be used to make horizontal integrated circuit structures of the type shown in FIGS. 6B and 7A.

FIG. 7B is a fragmentary plan view of a partially completed integrated thin film structure which may be completed to form the electro-optical device 250 shown in FIG. 7A. The layout of FIG. 7B may best be understood by frequent reference to the schematic diagram of FIG. 7A and to the fragmentary cross sectional view of the completed electro-optical device structure 250 shown in FIG. 7C. As best shown in FIG. 7C, the device 250 may be formed by depositing and patterning a gate layer to form gates G1 and G3, followed by the deposition and patterning of a gate insulating layer into gate insulators 156 and 156', followed by the deposition of an intrinsic layer 158 which need not be patterned, followed by the deposition of an n+ layer which is patterned into n+ layers 162 and 162', as well as a portion of resistor 242', followed by the deposition of electrode metal which is patterned into electrode A1 and A3, as well as the top contact for resistor 242'. Note that the top electrode metal, once deposited and patterned, may also be used to form the metallic electrode A1 of transistor 152 and the metallic electrode A3 for transistor 152' shown in FIG. 7. A portion 256 of the n+ layer is patterned so as to form part of the resistor 242'. The other part of resistor 242' is formed by the deposition and patterning of a portion of the p+ layer which is also used to form the p-type layer of anodes A1 and A3.

FIG. 7D shows a partial cross-sectional view of layer portions 256 and 260 touching one another to form the resistor 242'. The junction of a heavily doped p-type and n-type layers of amorphous silicon alloy generally result in an ohmic contact thus avoiding the formation of a rectifying junction in resistor 242'. The resistor 242' makes contact with the gate G3 through the intrinsic layer 158 directly beneath it as shown by dashed line 258, which showed the gate metal extending under n+ portion 256. The crossed hatch region of n+ portion 256 represents that part of resistor 242' covered with a top metal layer 262.

In operation, DIFET 152 of electro-optical device 250 is turned on, and thus produces light which travels along layer 158 in a generally horizontal direction as indicated by wavy arrow 264 in FIG. 7C. The presence of sufficient quantities of light causes the resistivity of the intrinsic layer 158 to detectably fall in region 266 located under the top metal contact portion 262 that forms the photoresistor 124. This biases the gate G3 of DIFET 152' towards zero volts, turning the DIFET off. This causes the output voltage signal $v_o$ connected to anode A3 of DIFET 152' to rise dramatically toward the voltage represented by common line $v_{cc2}$.

Figure 8A:
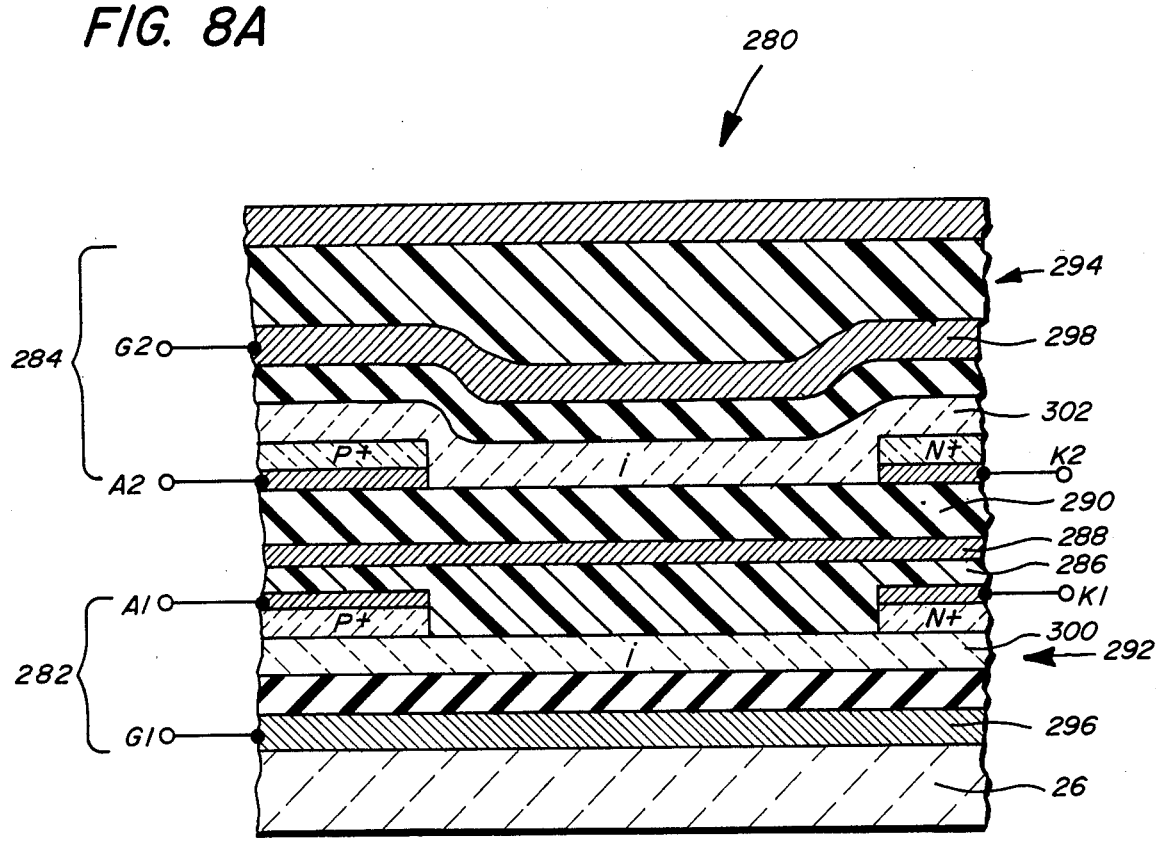
FIG. 8A is a cross-sectional view of still another electro-optical device of the present invention, which has two DIFETs vertically arranged.
Figure 8B:
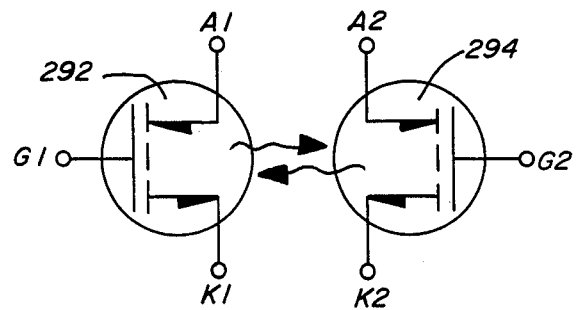
FIG. 8B is its schematic diagram which shows that the communication between the two DIFETs may be bidirectional.

FIG. 8 is a fragmentary cross-sectional view of a vertically arranged multilayered integrated circuit structure 280 which embodiess a pair of bidirectional optical transceivers composed of light emitting and photosensitive transistors of different device planes. FIG. 8B shows a schematic diagram of the FIG. 8A structure. FIG. 8A includes two device planes 282 and 284 separated by a plurality of optically transparent layers 286, 288 and 290. Layer 286 is a leveling layer, such as polyimide. Layer 288 is a metallic ground plane deposited continuously over the leveling layer 286. Layer 290 is an insulating layer for separating all devices on device plane 284 from the ground plane 288. Although not shown, ground plane 288 is extended between substantially all vertically adjacent components in device planes 282 and 284 so as to electrically and/or magnetically isolate the integrated circuits in device plane 282 from those in device plane 284. The electro-optical device 280 provides optical communication paths so that control signals and/or data signals may readily be transmitted between device planes 282 and 284. Ground plane 288 can if desired be attached to a common system ground, or can be left to float. As those in the art will appreciate, metallic plane 288 provides excellent shielding to prevent RIF, ESD and EMI effects between the two device planes. By use of similar ground planes above and below every device plane (or selected plane) in a three dimensional integrated circuit structure having multiple device planes or layers, an integrated circuit structure having superior immunity to the aforementioned types of electromagnetic noise may be constructed. It is well known that amorphous silicon alloys and integrated electronic circuit devices made therefrom are radiation hardened, that is they are not subject to deterioration by exposure to high energy rays such as x-rays, beta rays or even gamma rays. Accordingly, a three dimensional integrated circuit structure made from such semiconductor alloys and protected by a plurality of metallic ground planes such as ground plane 288 interposed between, above and below the top and bottom most layers will provide an extremely durable integrated circuit system very immune to most types of disturbances which could be expected in very harsh industrial environments, such as high energy physics laboratories, outer space and under combat conditions involving the release of unusually strong electromagnetic pulses which may damage non-hardened and/or suitably protected circuitry. Thus, the use of such ground planes can be very advantageous in selective applications. To the extent that electrical and/or magnetic noise may be an adverse condition to be contended with, the use of such metallic ground planes in conjunction with the electro-optical devices of the present invention for communications between device planes provides a very neat and clean solution.

The device 280 of FIG. 8A contains a pair of DIFETs 292 and 294. Difet 292 is located in device plane 282 and DIFET 294 is located in device plane 284. The DIFETs 292 and 294 are in a spaced apart facing relationship so that the gate layers 296 and 298 respectively of the DIFETs 292 and 294 are the outermost layers of the DIFETs, while the intrinsic layers 300 and 302 of DIFETs 292 and 294 respectively are among the closest layers of the two devices. Accordingly, the radiant energy or light travelling between the two intrinsic layers 300 and 302 only need pass through leveling layer 286, ground plane 288 and insulating layer 290.

It should be appreciated that ground plane 288 may not be used if in the electro-optical device 280, unless one seeks to truly minimize the possibility of electrical or magnetic interference between the layers. For example, if the leveling layer 286 or the insulating layer 288 are made substantially thicker, this would substantially reduce any magnetic or electrical coupling between the layers, thus rendering the ground plane possibility unnecessary except in the most demanding and critical applications or designs. Also, if leveling layer 286 is made from an insulative material compatible with the other material used for devices in planes 282 and 284 with which it comes in contact, the insulating layer 290 may be dispensed with.

Figure 9A:
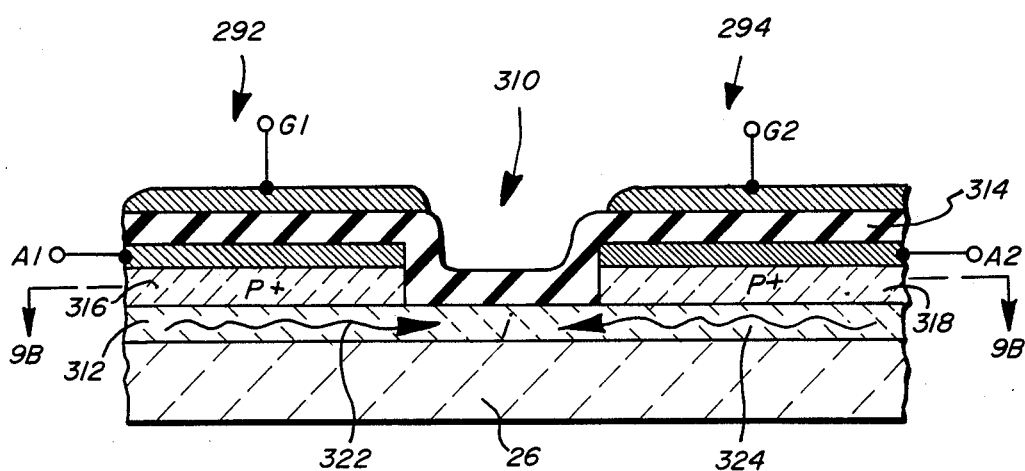
FIG. 9A is a integrated structure of the type depicted in FIG. 8B which is horizontally arranged to provide optical communication along a common optically active layer.
Figure 9B:
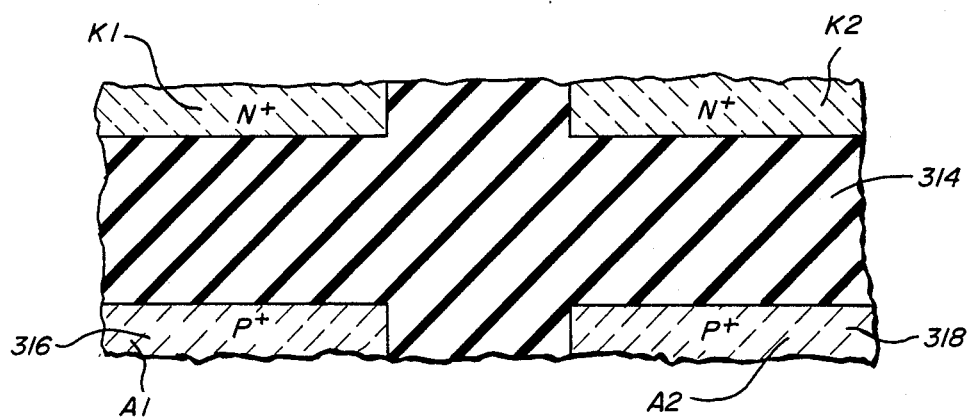
FIG. 9B is a cross-sectional view of the FIG. 9A device taken along line 9B—9B and showing the location of the anode and cathode of each DIFET.

FIG. 9A shows a horizontal electro-optical device 300 of the present invention which may be used to implement the bidirectional optical communication structure schematically illustrated in FIG. 8B. FIG. 9A is an end view in cross-section of transistor 292 and 294. It should be understood that the transistors 292 and 294 are arranged in a side by side relationship of the kind illustrated in FIG. 7B. FIG. 9B is a plan view taken in cross section along line 9B—9B of FIG. 9A which helps illustrate the horizontal arrangement of DIFETs 292 and 294. A common intrinsic layer 312 and common gate insulating layer 314 extends between the two transistors. The two p+ layers 316 and 318 are formed by simultaneously patterning an initially deposited continuous layer of p+ material. Similarly, the gates G1 and G2 may be formed by simultaneously patterning a previously deposited top layer of metal.

In operation, the DIFETs 292 and 294 of electro-optical device 310 communicate optically along planar intrinsic layer 312. As will be explained more fully with respect to the FIG. 10 embodiment of the present invention, DIFETs are able to act as photoreceivers under certain conditions. Accordingly, when DIFET 292 is optically transmitting information in the form of light pulses passes along layer 312 as represented by wavy arrow 322, DIFET 294 can detect such optical pulses. Similarily, when DIFET 294 is optically transmitting information by the generation of light pulses represented by wavy arrow 324 shown in intrinsic layer 312, DIFET 292 can detect these light pulses. As can be seen from FIGS. 9A and 9B, the fabrication of electro-optical device 310 involves a fairly limited number of processing steps of the type well known to those skilled in the thin film processing art.

Figure 10A:
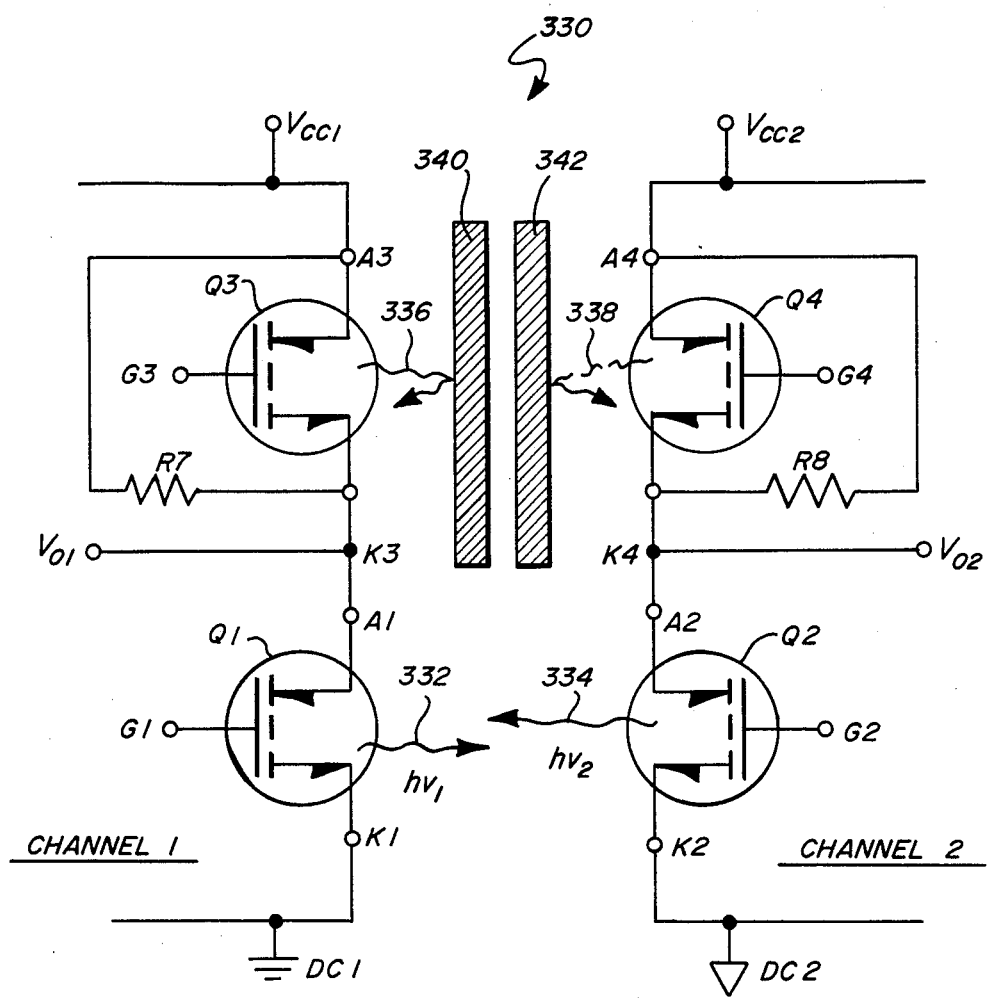
FIG. 10A is a schematic diagram of a two channel optical-to-optical communication system employing four DIFETs.

FIG. 10A is a schematic diagram of the next embodiment of the present invention which is a two channel optical-to-optical communications circuit which can be implemented in either a completely horizontal arrangement, or a completely vertical arrangement, or a hybrid arrangement having devices arranged vertically among adjacent device planes and horizontally on the same device plane. One such hybrid arrangement is shown in FIG. 10C and 10B and will be described shortly.

The schematic diagram of FIG. 10 shows that the integrated communications channel structure 330 may be implemented using four DIFET transistors Q1 through Q4. Difets Q1 and Q3 are associated with channel 1 and DIFETs Q2 and Q4 are associated with channel 2. The channel 1 components may be wired as shown, including a resistor R7 connected between the anode A3 and cathode K3 of DIFET Q3. The devices of channel 2 may be connected as shown, including a resistor R8 connected between anode A4 and cathode K4 of DIFET Q4. Wavy arrows 332 and 334 emanating from DIFETs Q1 and Q2 respectively, serve to indicate that bidirectional optical communication is possible between channels 1 and 2. The channels may be completely electrically isolated as is indicated by the presence of two sets of power sources (VCC1, DC1 for Channel 1; VCC2 and DC2 for Channel 2) if DIFET Q3 and DIFET Q4 emit light, as indicated by wavy arrows 336 and 338 respectively, this potentially could interfere with the operation of the structure 330, depending upon the physical locations of the four DIFETS in the structure with respect to one another. Light ray 336 and 338 may be blocked if desired or necessary by light barriers 340 and 342 schematically illustrated FIG. 10A as fixed metal layers.

Figure 10B:
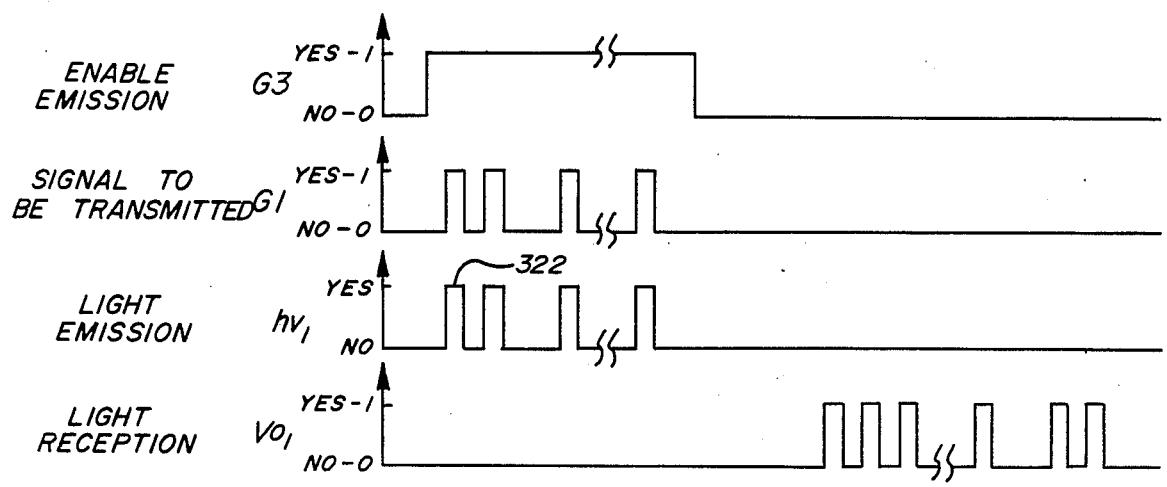
FIG. 10B is a sample timing diagram of the FIG. 10A circuit illustrating the bidirectional nature of the FIG. 10A device.
Figure 10B:
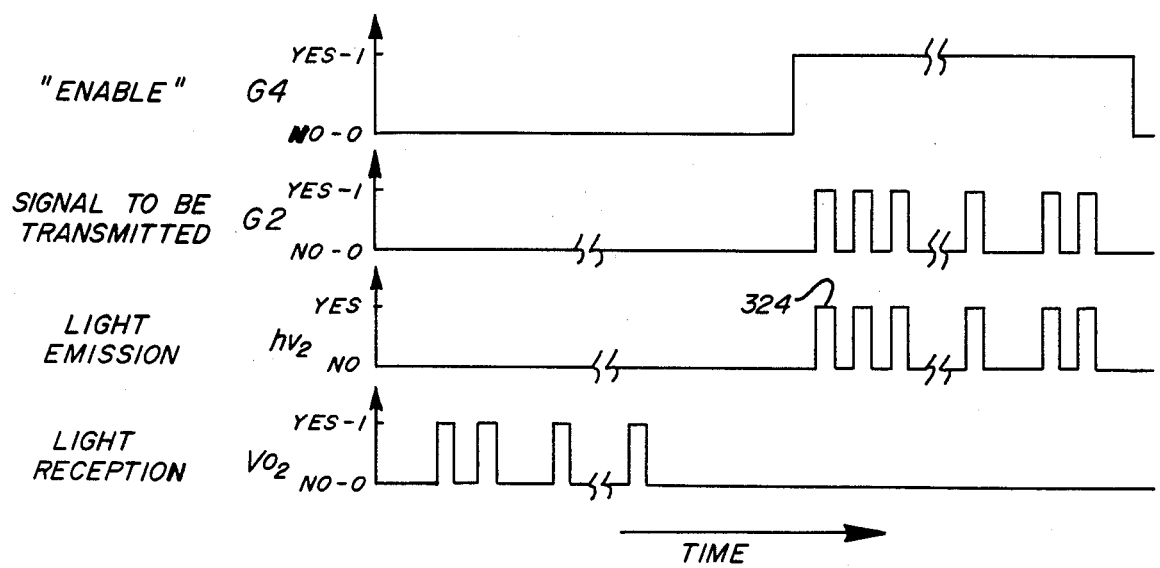

FIG. 10B is a timing diagram which when read in conjunction with the schematic diagram of FIG. 10A, reveals how communication structure 330 operates. Simply stated, when channel 1 is optically transmitting information, channel 2 is in a passive, that is non-light emitting, state. Conversely, when channel 2 is optically transmitting information, channel 1 is in a passive state. The operation of device 330 may be fully understood simply by studying the timing diagram of FIG. 10B, once the following point is preliminarily understood. When DIFET Q1 (or DIFET Q2) is in a passive state, it detects the optical transmissions of the other DIFETS by the same basic circuit concept presented in FIG. 1C. In other words, resistor R7 (or resistor R8) acts as pull up resistor to make the output voltage $v_{01}$ (or $v_{02}$) approach the bus voltage $v_{cc1}$ when no optical transmissions are detected. However, when an optical transmission is detected, the resistivity of DIFET Q1 (or Q2) dramatically decreases on account of the fact that a DIFET constitutes a forward-biased p-i-n diode when it is not turned on (when the gate is simply allowed to float or is pulled toward its respective DC common voltage level). Thus, if the value of resistor R7 (or resistor R8) is properly chosen with respect to the dark and light resistivities of DIFET Q1 (or DIFET Q2), the output voltage $V_{01}$ (or $V_{02}$) will pulsate with each pulse of light from the DIFET of the other channel which it detects.

Figure 10C:
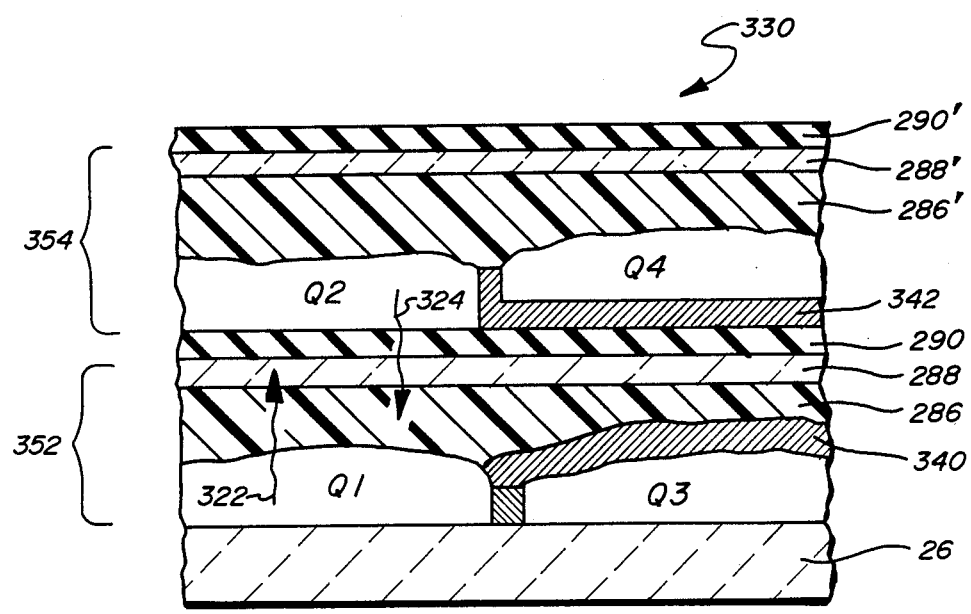
FIG. 10C is a simplified cross-sectional view of an integrated circuit structure for implementing the two channel system of FIG. 10A.

FIG. 10C is a simplified cross-sectional view of one possible hybrid embodiment of communication structure 330 having transistors Q1 and Q3 horizontally arranged adjacent one another on a first or lower device plane 352, and transistors Q2 and Q4 horizontally arranged adjacent one another on a second or upper device plane 354. The transistor devices of plane 352 are separated from those of plane 354 by a plurality of intermediate layers 286, 288 and 290 of the same type described with respect to device 280 in FIG. 8A. Additionally, FIG. 10C shows light barriers 340 and 342 formed of layers of metal above DIFET Q3 and below Q4 respectively. If additional device planes are required above layer 354, a second plurality of layers 286', 288' and 290' can be formed on top of DIFETs Q2 and Q4 in the same manner that layers 286 through 290 are formed above DIFETs Q1 and Q3.

Figures 10D, 10E:
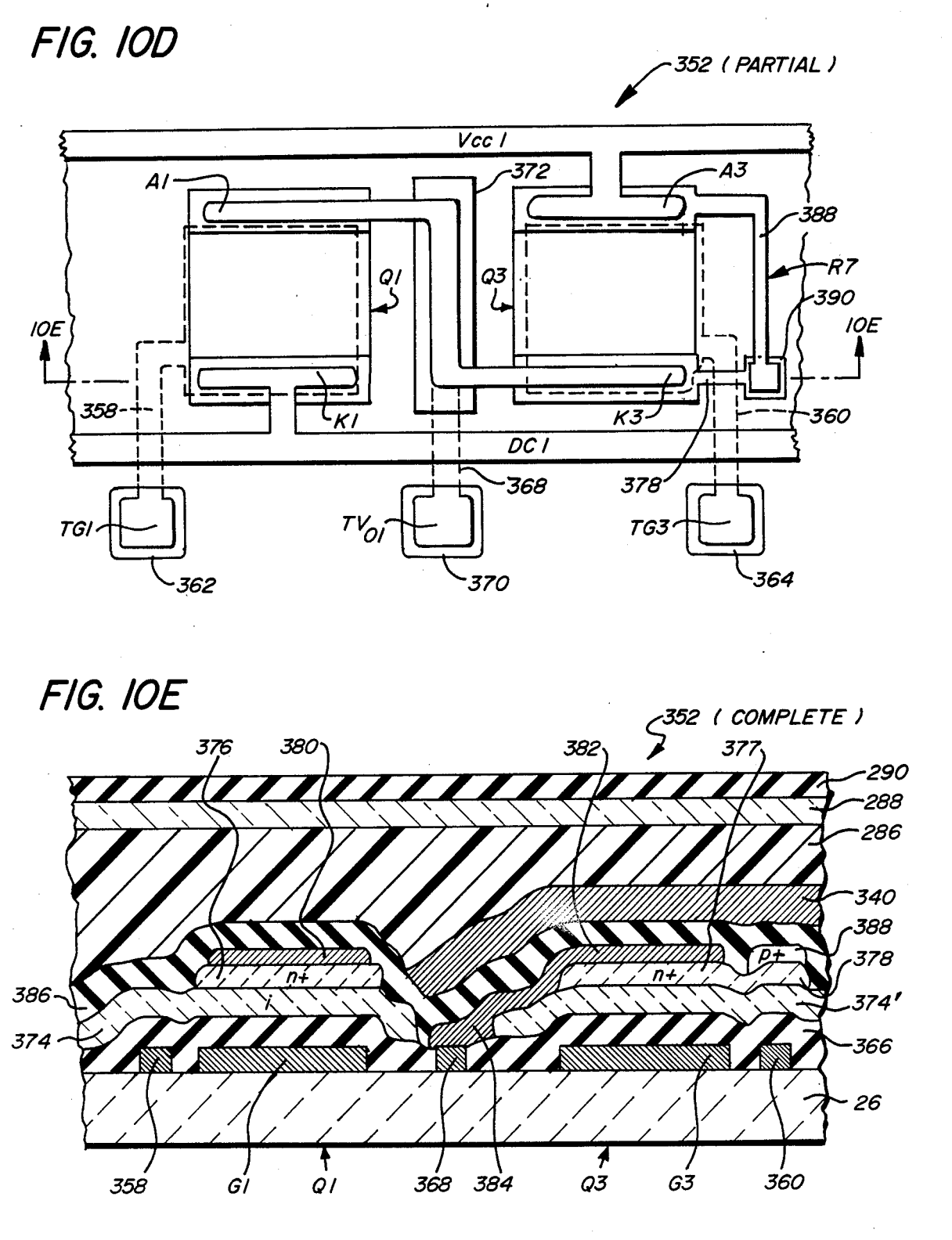

FIG. 10D shows a simplified illustrative plan view of the circuit devices of device plane 352 in a partially formed state. FIG. 10E is a cross-sectional view of device plane 352 shown with all layers formed, which is taken along lines 10E—10E of FIG. 10D. As can be best seen in FIG. 10E, the device plane 352 is formed by depositing successive layers, and patterning certain of those layers after they have been deposited generally before the succeeding layers are deposited. Those skilled in the art can readily determine the precise sequence of processing steps required to form and pattern the layers so as to produce the structures represented in FIGS. 10D and 10E, and accordingly, the processing sequence will only be reviewed in general terms herein. FIG. 10E includes an initially deposited metal layer to form the gates G1 and G3 of transistors Q1 and Q3, as well as the traces 358 and 360 used to interconnect the gates G1 and G3 to terminal pads TG1 and TG3, respectively, which are shown in FIG. 10D being exposed through vias 362 and 364 formed in the gate insulating layer 366. In a similar fashion trace 368 is also formed from the initially deposited bottom layer of metal to provide a connection for the output $V_{01}$ node of channel 1 to its terminal pads $TV_{01}$ exposed through via 370 in the gate insulating layer 366. After the gate insulating layer 366 has been deposited and vias 362, 364, 370, and 372 formed therein, an intrinsic semiconductor layer 374 is applied and subsequently patterned into intrinsic layer portions 374 and 374' respectively associated with transistors Q1 and Q2 as shown in FIG. 10E. Then, an n+-type semiconductor layer is continuously deposited and subsequently patterned to form portions of the cathodes K1 and K3 of transistors Q1 and Q3 as well as resistive portion 378 of resistor R7, which can be seen on the right hand side of FIGS. 10D and 10E. Next, the electrode metal for the cathodes K1 and K3 is deposited and then patterned as shown in FIG. 10E to form electrode portions 380 and 384 as shown in FIG. 10E. The portion 384 which extends from the n+ layer 377 to trace 368 is used as a light barrier to ensure that any radiation which may be generated in the i-layer portions 374 or 374' by transistors Q1 or Q3 respectively does not travel in a horizontal direction and reach the intrinsic layer portion of the other adjacent horizontal transistor.

After depositing and patterning the p+ layer and metal electrode layer for the anodes A1 and A2, an insulating layer 386 may be deposited over the entire transistor structure of device plane 352 or at least over the structure of transistor Q3, as preparation for the subsequent deposition and patterning of light barrier layer 340. A light barrier layer need only be formed over transistor Q3, and should not be formed over transistor Q1, lest the optically transparent path between transistor Q1 and Q2 indicated schematically by wavy arrows 322 and 324 in FIG. 10C be blocked. As a final note, it will be seen that resistor R7 in FIG. 10D is completed by having p+ conductive portion 388 extend from anode A3 to a location 390 substantially parallel with and spaced apart from cathode K3 where it makes ohmic contact with n+ layer portion 378.

Figure 11:
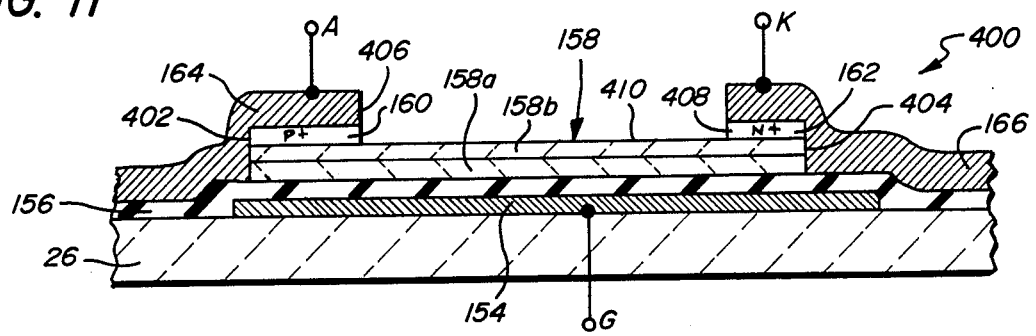
FIG. 11 is a cross-sectional view of a light-emitting DIFET which may be used in the present invention having two output frequencies.
Figure 12A:
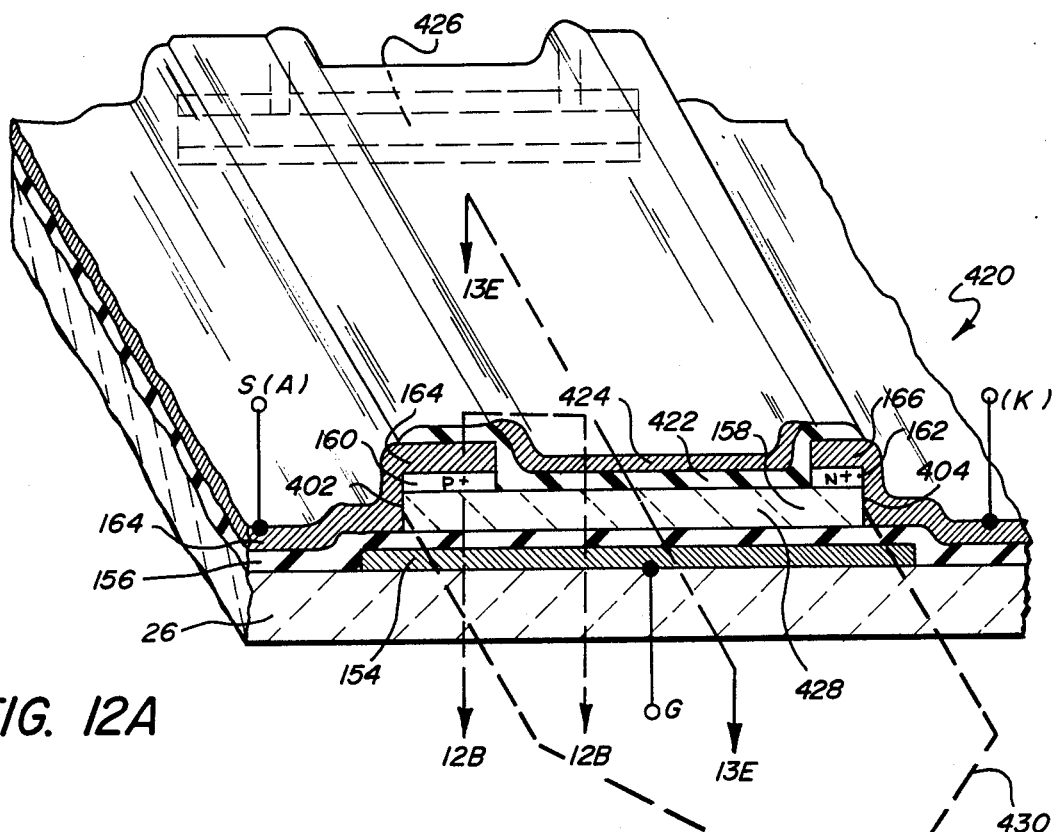
FIG. 12 is a perspective view of a light-emitting DIFET having a tuned optical cavity for coherent light-emission and FIG. 12B is a partial cross-section of the FIG. 12A device taken along lines 12B showing the thickness of various layers in terms of wavelengths.
Figure 12B:
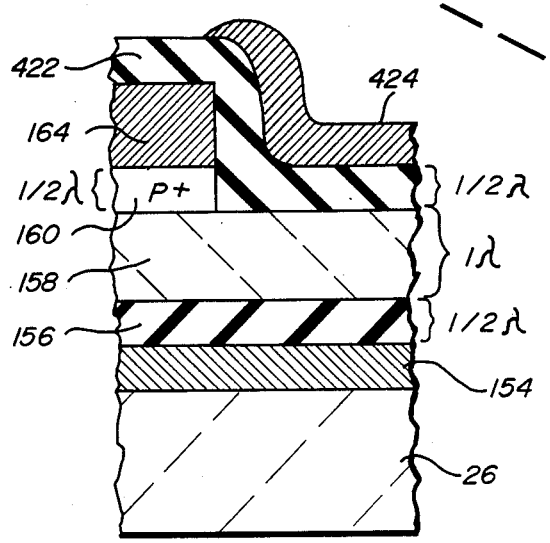

FIGS. 11, 12A and 12B are taken from U.S. patent application Ser. No. 788,594, previously mentioned and incorporated by reference (see FIGS. 39, 40A and 40B therein), and are repeated here since the electroluminescent and lasing DIFETs which they depict are well suited to be used in the various embodiments of the present invention, as will be briefly described.

FIG. 11 is a cross-sectional view of a electroluminescent DIFET having a plurality of separated junctions in the active region thereof for producing a variable frequency optical output. The effective cross-sectional areas of the p+ and n+ layers associated with the anode and cathode of the device are arranged to provide for optimized space charge neutralization in the active region. The transistor 400 shown in FIG. 11 is an amorphous silicon alloy, three terminal DIFET constructed with different sized p+ and n+ electrodes to assist in optimized neutralization by the matching of effective areas of electrodes as previously described. The DIFET 400 may be constructed in the same basic manner as DIFET 152 shown in FIG. 3A, but with an additional set of photoresist deposition, patterning and development steps to create vertical outer sides 402 and 404 along layers 158a, 158b, 160 and 162 as shown, and to create vertical inner sides 406 and 408 respectively along layers 160, 164 and 166.

Layer 158 of the FIG. 11 device may be comprised of a plurality of sublayers 158a and 158b as shown. Sublayer 158b, it will be noted, is separated from the gate insulator 156 by sublayer 158a. Each of the sublayers has a band gap distinct from that of the other to allow DIFET 400 to selectively emit radiation (e.g., visible light) at two or more wavelengths.

The wavelength of the emitted light may be less than the band gap, particularly in amorphous materials where substantial numbers of the defect states remain unfilled. Layer 158a, for example, may be made of substantially intrinsic amorphous silicon alloy which has a band gap of 1.7 eV (corresponding to an emission wavelength of about 7300 angstroms, or more). Layer 158b, for example, may be made of substantially intrinsic amorphous silicon alloy with significant amounts of carbon added, so as to produce a band gap greater than 1.7 eV, for example, 2.5 eV (corresponding to an emission wavelength of about 5000 angstroms, or more). In operation, the width of the space charge region of DIFET 400 increases as gate voltage is increased. Thus, the spectrum of the optical output of DIFET 400 may be varied by appropriately varying the applied gate voltage as follows. The FET 400 is driven at a selected first gate voltage to produce emissions which are largely at one wavelength due to carrier recombination in layer 158a, and is driven at a second larger gate voltage to produce emissions at both wavelengths due to carrier recombination in both of layers 158a and 158b. The former result is achieved when the thickness of the band bending region extends into layer 158a, and the latter result is achieved when the thickness of the band bending region extends fully across layer 158a and a substantial distance into layer 158b.

Those in the art should appreciate that a DIFET having a single homogeneous layer 158 may also be made to emit light at different frequencies by varying the gate voltage. Specifically, the frequency of light emissions produced by a DIFET may be modulated between two or more distinguishable frequencies (or narrow bands of frequencies) which are reasonably close to one another by modulating the gate voltage so as to alter the energy difference between the electron and hole quasi-Fermi levels, whether this be when they lie in defect states which are partially unfilled or in the extended states. If the quasi-Fermi levels do lie in the extended states, increasing gate voltage will push them further into these extended states.

The amplitude or intensity of light emissions of a DIFET can also be varied by varying the gate voltage. Also, the amplitude and even the frequency of the light emissions can be varied by modulating the applied anode-cathode voltage, since this will also influence current in the DIFET.

The light produced may exit from DIFET 400 through the upper horizontal surface 410 between electrodes 164 and 166. Exterior sides 402 and 404 will not provide an exit for the light if metal 164 and 166 is made thick enough to substantially block or reflect such emissions. A suitably thick layer of reflective material may be used to block light from escaping from other surfaces, if desired. The light may also be made to exit from the bottom of DIFET 400 by forming gate layer 154 from a transparent conductive material such as indium tin oxide or tin oxide, and utilizing a transparent material, such as glass, for substrate 26.

FIG. 12A illustrates a three terminal DIFET 420 of the present invention which has a resonant optical cavity and forms a solid-state semiconductor laser from amorphous semiconductor material, preferably an amorphous silicon alloy. This DIFET laser 420 may be constructed in a manner similar to that of DIFET 400 of FIG. 11, with the addition of top insulating layer 422 over the most of the device and of top metal layer 424 in the center of the device as shown.

It is well-known to those skilled in the art of solid-state lasers that the fundamental light-producing mechanism in the semiconductor of a solid-state laser is the direct recombination of conduction-band electrons and valence-band holes. DIFET 420 contains a suitable Fabry-Parot optical cavity, and the lasing threshold is reached when a light pulse can make a round trip in the cavity without undue attentuation, which satisfies as is described further in U.S. patent application Ser. No. 788,594. By properly selecting the various layers of materials as described in the application, optically significant changes in indexes of refraction between these layers can be obtained, thereby forming a optical cavity having the substantial internal reflection required in a semiconductor laser. The channel length, the channel width and the thickness of one or more selected layers in DIFET may also be chosen as described in the application so as to form a suitable resonant optical cavity. In one arrangement, semiconductor layer 158 may be one-half or one wavelength thick. Suitable insulating materials for layers 156 and 422 include any known to those in the semiconductor laser are which are compatible with adjacent layers of DIFET 420. Silicon nitride, silicon oxide, or a high dielectric constant insulator, such as tantalum oxide, may be satisfactory. Layers 156 and 422 may be made of different materials. The processing temperatures of the material selected for layer 422 should not be so high as to damage the electronic or optical properties of layer 158. FIG. 12B is an enlarged view of a portion of FET 420 showing one preferred arrangement of the relative thicknesses of the layers in the device as a function of the wavelength of the coherent light to be produced.

In laser configurations of the type illustrated in FIG. 12B, layers 154 and 424 are preferably made of a metal having a high reflectivity at the wavelength of the laser light. If semiconductor layer 158 is formed of an amorphous silicon alloy, for example, silver, copper, gold, chromium or aluminum may be satisfactory for use as a high reflectivity material for layers 154 and 424. A high reflectivity material preferably covers the vertical side surfaces 402 and 404, which form the sides of the optical cavity. The vertical surface 426 forming the rear end of the optical cavity is also preferably covered with a reflective insulating material, or otherwise prepared in any suitable or conventional manner to form a substantially reflective end that does not short the anode to cathode. The vertical surface 428 forming the front end of the optical cavity is preferably partially reflecting to increase lasing action between the two cavity ends. This may also be accomplished by using an insulating material or in any conventional or suitable manner.

In operation, when DIFET 420 is driven hard enough, enough of the defect states in the a-Si alloy semiconductor material of layer 158 are pushed into the quasi-Fermi levels of electrons and holes into the conduction and valence bands respectively, and to permit significant levels of direct recombination to occur, since the defect states or traps should be substantially filled, thereby producing photon emissions. At this point, given optical cavity surfaces and ends which are sufficiently reflective, lasing threshold will be reached, and coherent light emission will take place. Since layers 154 and 424 largely block the light and since the side and rear surfaces are preferably made substantially reflective, most of the coherent light will be emitted from the vertical front surface 428 of layer 158, as indicated by broad arrow 430. To maximize lasing action in the direction of the major axis of the DIFET 420, which extends between the front and rear cavity ends, it is preferable to use relatively large W/L channel ratios. By reducing the channel length in DIFET 420 to a few microns or less, increased currents are possible, which should permit DIFET 420 to achieve coherent light emission at lower power levels. Both pulsed and continuous wave (CW) operation is contemplated for the laser DIFETs used in the present invention. CW operation will likely require some form of heat dissipation or cooling. This can be provided in any number of ways using techniques well known to those is the semiconductor laser art.

As previously mentioned with respect to FIG. 11, it is possible to modulate the amplitude and frequency of the optical output of the light emitting DIFETs of the present invention by modulating the applied gate voltage or by modulating the voltage between the current-carrying electrodes. These modulation techniques can also be used in the DIFET lasers of the present invention. For example, since the optical cavities described above will support resonance at selected frequencies within a relatively narrow band of frequencies about the nominal resonant frequency of the cavity, frequency modulation of the DIFET laser is possible. Accordingly, both the light emitting and lasing DIFETs of the present invention may be used to transmit information by modulating optical amplitude or frequency through changes in gate voltage. Since only the gate drive is being modulated, a relatively large power amplifier or switch is not required. Moreover, those in the art should appreciate that, if desired, the light emitting and lasing DIFETs of the present invention may be switched between an off state and an on state by suitable variations of the applied gate voltage. In other words, a relatively low power gate signal can control the optical output of a DIFET. This made possible by the large power gain inherent in the DIFETs of the present invention, and represents an important advantage over two terminal light emitting diodes and lasers wherein the main drive power must be switched off and on by a separate active power element. Such optical modulation by varying gate voltage may be carried out at rates of several tens or several hundreds of megahertz, which makes the light emitting and lasing DIFETs used in the present invention very valuable in communications and computer applications and in other applications as well.

Figure 13A:
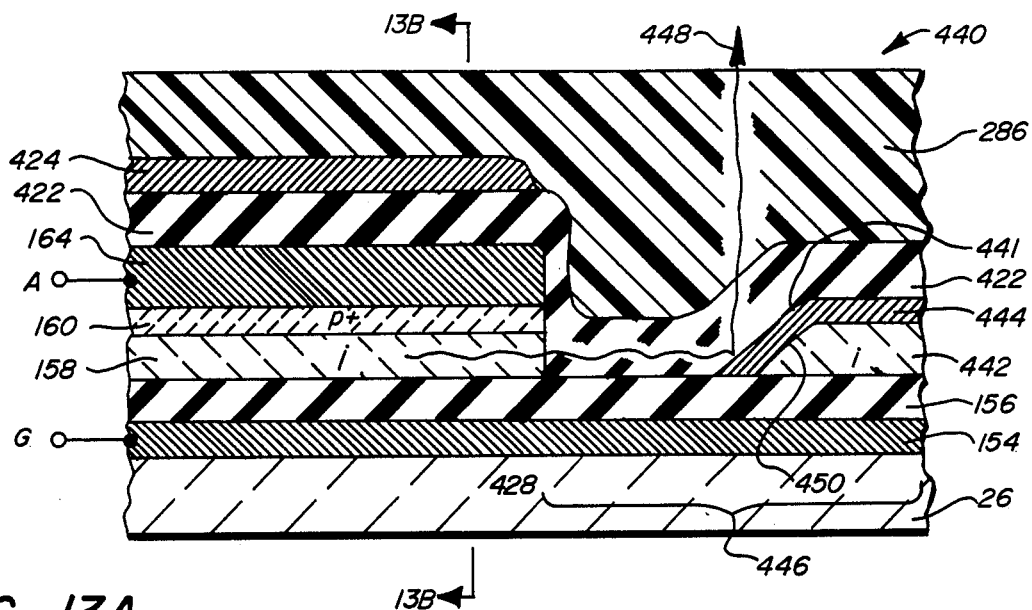
FIG. 13A is a partial cross-sectional view of an integrated DIFET laser of the present invention having an angled reflective layer for directing the laser light in a generally vertical direction.

FIG. 13A shows an integrated DIFET laser 440 of the present invention including a angled reflecting surface 441 laterally disposed to one end of the primary light emission surface 428 of the laser's optical cavity. The partial cross-sectional view of FIG. 13A can best be understood by realizing that it is very similar to the cross-sectional view one would see if such a view were taken of the DIFET laser 420 in FIG. 12A along lines 13E–13E. The basic difference between the DIFET laser 420 and the DIFET laser 440 is that the latter includes an additional region indicated by the bracket 446, which includes the reflecting surface 444. Wavy arrow 446 represents optical emissions from the optical cavity which includes intrinsic layer 158. As noted by the right-angle turn which wavy arrow 446 makes in FIG. 13A, the emissions from layer 158 are initially horizontal, and then are deflected in a generally upward direction as indicated by the vertical portion of arrow 446. If desired, insulating layer 442 may be used to cover the reflective layer 444, which is preferably a highly reflective metal of the type previously mentioned. The angled surface 450 is a part of material 442, which is preferably formed by appropriately patterning the intrinsic layer that forms 158 after it has been initially deposited as a continuous layer upon insulating layer 156. The angled surface 450 of region 442 can be readily formed by any number of suitable processing techniques well-known to those in the art. For example, U.S. patent Ser. No. 453,320 which issued on Sept. 24, 1985 in the name of M. Vijan, which has been previously cited and incorporated by reference, may be used to process deposited materials, such as amorphous silicon alloys, to form an angled surface such as surface 450.

Figure 13B:
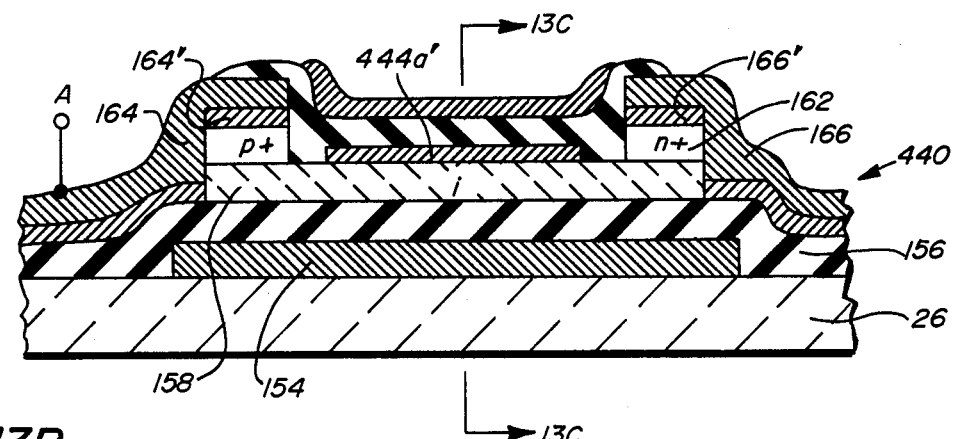

FIG. 13B is a cross-sectional view of the FIG. 13A device taken along lines 13B—13B. It shows that if desired, the metallic reflecting layer 444 may be applied continuously across the p+ i and n+ layers 160, 158, and 162, as well as across the angled material region 442, and be subsequently patterned to form the metal 444a on top of intrinsic layer 158, the metal electrode portion 164' and 166', as well as the reflecting layer 444 above material 442.

Figure 13C:
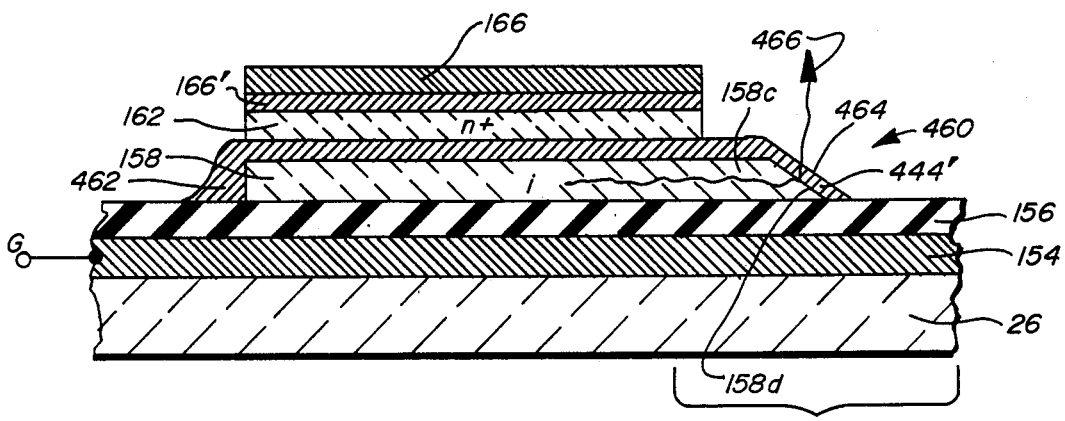

FIG. 13C shows an alternative embodiment of the present invention which possesses a lateral portion 462 having a different configuration than lateral portion 446. The cross-sectional view of DIFET laser 460 of FIG. 13C may be constructed as shown in FIG. 13B, with only the lateral portion 462 being different. Device 460 includes a refracting surface means comprised of an extended portion 158c of intrinsic layer 158, which includes beveled or angled surface 158b. The angled surface of 158b is patterned prior to the deposition of metallic layer 444'. When a directional deposition technique is used, the amount of material collected in the rear 462 of layer 444' is greater than the amount of material deposited in refracting portion 464. Accordingly, this deposition technique results in portion 462 being substantially totally reflecting, while portion 464 is only partially reflected. Accordingly, optical radiation generated within intrinsic layer 158 which is initially horizontally directed towards refracting surface 158d is refracted in a generally vertical direction as indicated by the vertical portion or arrow 466. Thus, the device 460 is an alternate structure including means for refracting optical emissions to change directions, that basically may be used in lieu of the DIFET laser 440 shown in FIG. 13A.

Figure 14A:
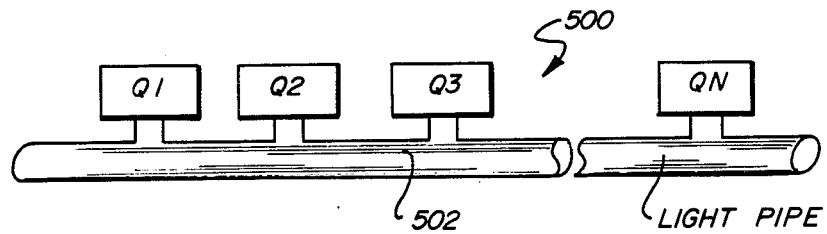
FIG. 14A is a pictorial representation of a multi-port electro-optical communication device of the present invention.

FIG. 14A is a highly schematic representation of a multi-port optical communications channel structure 500 of the present invention, which include a plurality of electro-optical devices, such as light-emitting transistors, preferably DIFETs, which communicate along a common optical channel or bus 502. The optical cavity 502 may be a common active semiconductor layer shared by all of the light emitting transistors. The transistors are preferably horizontally spaced apart along the common optical cavity or layer. The number of light-emitting channels which can be handled by the common optical conduit 502 depends upon the transmissivity of the material used for the conduit, as well as the intensity and frequency of the optical emissions of the various light-emitting transistors.

Figure 14B:
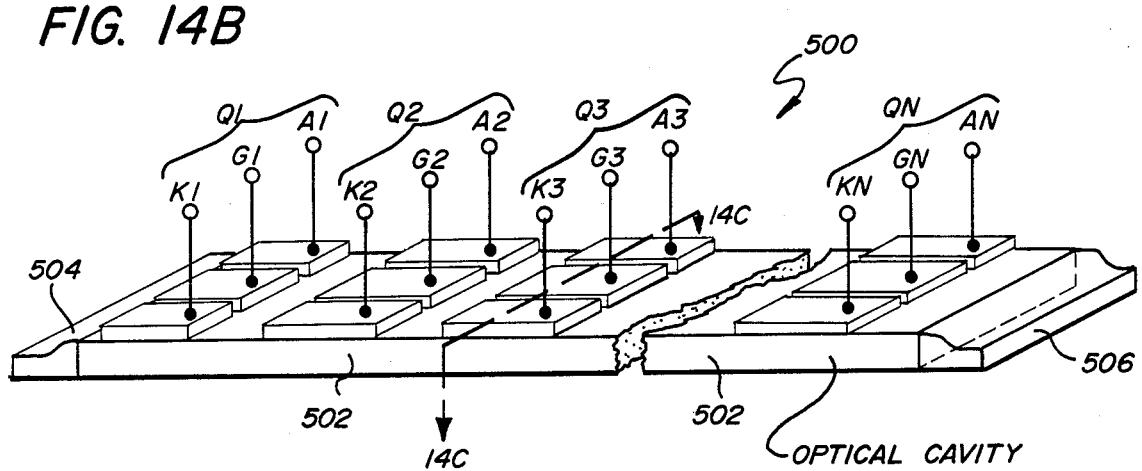
FIG. 14B is a highly simplified perspective view of the FIG. 14A device.

FIG. 14B is another fairly schematic representation of the communication structure 500 showing how the transistors Q1, Q2, Q3 through Qn might be horizontally arranged along the optical conduit 502. The conduit 502 is preferably completely flat to maximize optical transmissions therein, and preferably includes end cap 504 and 506 of highly reflective material to reflect light which reaches the ends of conduit 502 back toward the photo-active transistors.

Figure 14C:
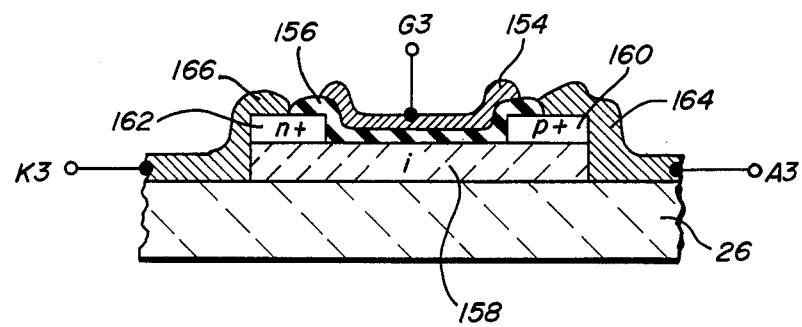
FIG. 14C is a cross-sectional view of the FIG. 14B device taken along one of the DIFETs utilized in the FIG. 14A device.

FIG. 14C shows a typical cross-section of one of the photo-active transistors used in the communication structure 500, as seen in cross-section taken along lines 14C—14C of FIG. 14B. Those in the art will appreciate that the photo-active transistors of the integrated communication structure 500, if DIFETs or an equivalent type of light-emitting and light-receiving device, can be operated in the manner described at length with respect to the FIG. 10 device (the bidirectional communications channel employing DIFETS).

Figure 15A:
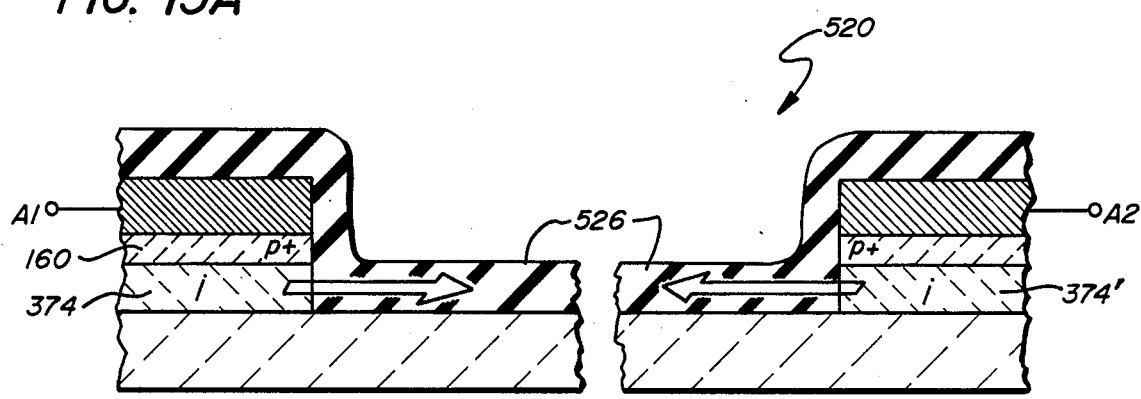
FIG. 15A is a partial cross-sectional view of an electro-optical bidirectional communication channel useful in large area integrated circuit structures having a pair of DIFET lasers which communicate with one another through an optically transparent channel.
Figure 15B:
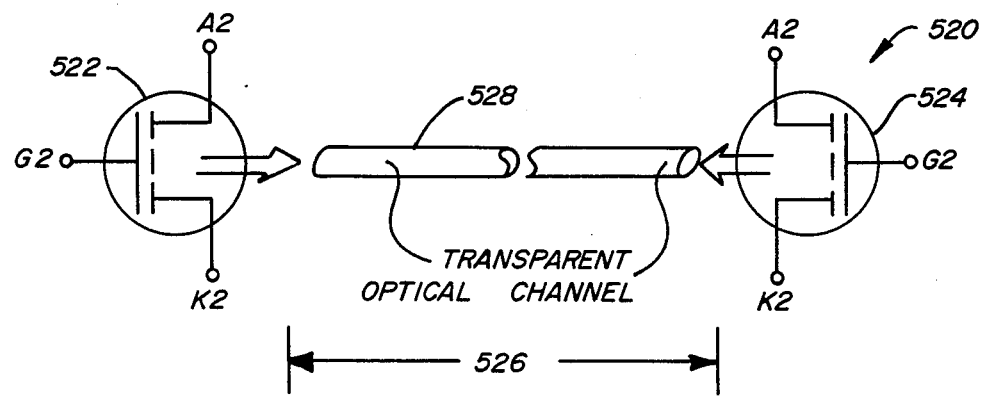
FIG. 15B is a schematic diagram of the FIG. 15A device.

FIG. 15A is a longitudinal side view in cross-section of an integrated communications structure 520 of the type schematically illustrated in FIG. 15B. As shown in FIG. 15B, the communications structure consists of a plurality of photo-active transistors 522 and 524 connected over a distance 526 which may be several orders of magnitude larger than the feature size of the integrated transistors 522 and 524. Communication structure 520 is particularly well adapted to be used to communicate along substantial distances, such as 2, 4, 6, 8 or more inches of a very large area integrated circuit structure, which be of the thin film type, or alternatively of the crystalline type grown on wafers in the crystalline semiconductor industry, which includes the gallium arsenide based semiconductor devices and structures. Unlike crystalline silicon, both amorphous silicon alloy semiconductor materials and crystalline gallium arsenide semiconductor materials have direct band gaps, which means that radiative recombination between electrons in the conduction band and holes in the valence band is practical. Assuming that optical communications along the optical conduit 528 which interconnects the transistors 522 and 524 can take place at a high enough frequency rate, the problems associated with transmission delays of electric signals over long distances within VLSI or ULSI electronic circuit structures can be largely eliminated by using an optical-to-optical communications path of the type schematically shown in FIG. 15B. Use of this technique also improves the signal-to-noise ratios over such long-distance communication paths within such structures, and would very likely greatly simplify the complex routing problems of such structures by reducing the effective area, i.e., real estate required in the structures for such communication paths.

FIG. 15A shows that the optical channel 526 is preferably formed of an insulating material having a very wide band gap, such as silicon oxide, silicon nitride, silicon carbide, or the like, which would greatly reduce the transmission losses as the light moves from one transistor to the other. The transistors 520 and 522 preferably take the form of DIFET lasers of the type shown in FIG. 12A. FIG. 15A illustrates that such structures may be formed simultaneously by depositing and then patterning subsequent layers of semiconductor, conductive and insulating materials in the manner previously described with respect to other bidirectional communication structures of the present invention.

FIG. 16A is a perspective view of two integrated circuit structures 540 and 542 each having multiple device planes, and each being equipped with one or more light-emitting DIFETs on the sides 544 and 546 of structures 540 and 542 respectively, said sides facing one another. As indicated by broad arrow 548, a DIFET 550 located in one of the device planes can optically transmit information to a photoreceiving device or devices located on face 546 of structure 542. Similarly, broad arrow 552 illustrates that light-emitting DIFETs formed adjacent side 546 of multiplane structure 542 may communicate with one or more photoreceivers located on face 544 of structure 540. Thus, bidirectional optical communication between photo-active devices of the two structures is possible. For this type of application, light-emitting DIFETs of the type shown in FIGS. 9A and 12A are preferred since it is believed they provide the optical emissions which have the greatest intensity and most focused beam of all of the integrated electro-optical devices of the present invention. Those in the art will appreciate that the communication principles illustrated in FIG. 16A need not be bidirectional, but can be unidirectional if desired, and can be employed between two adjacent integrated thin film structures which each may only have one device plane.

Depending upon the spacing between the faces 544 and 546, the intensity and directionality of the light emissions from the electro-optical devices, and the quality of the photoreceiving devices, it may or may not be necessary to use more than one photo-transmitting or photoreceiving device per channel in the communication structure. As illustrated by area 546 on face 544, a plurality of photoreceivers may be used to detect the light emission being sent by the other integrated structure. In particular, photoresponsive devices, such as p-i-n diodes, photoresistors or DIFETs used in their photoresponsive mode, may be employed in an array consisting of two or more devices on a single device plane, or even two or more devices distributed amongst two or more device planes. For example, in FIG. 16B photoreceiver area 546' is shown having a total of 20 photosensors 549 distributed amongst four distinct device planes 551, 553, 555 and 557. By using such an array of multiple photosensors on a single device plane or on multiple device planes, problems with critically aligning the direction of the emitted beam from one structure to a distant integrated circuit structure can be minimized or even substantially eliminated. Also, this technique of using an array of multiple sensors makes it less important to use a tightly collimated beam from the light-transmitting device. Finally, the use of a photo-sensing array of the type depicted in FIG. 16B should permit the integrated structures to be spaced apart across relatively large distances. This should prove most useful when several ULSI computers or mass storage memories are placed upon the same substrate or printed circuit board and must be interconnected to one another.

FIG. 17 is a schematic illustration of another embodiment of the present invention, namely the optical communication from a DIFET laser on one board or surface 570, such as a computer board or driver and/or control board usable in a flat panel display, through an optical conduit 572, such as an optical fiber of the type well-known to those in the art, to a remote optical receiver located on another board 574, some distance from board 570. The use of the optical fiber makes it unnecessary to provide a line-of-site relationship between the transmitter, DIFET laser 576, and the optical receiver 578 on board 574. As is well-known in the art, the use of optical conduits such as optical fibers prevents the spreading of the light transmitted therethrough since such light is largely, totally, internally reflected by the differences in index of refraction between the optical conduit and the material surrounding the optical conduit. Accordingly, the use of straight or curved optical conduits such as optical fibers in conjunction with solid-state thin film integrated photo-transmitting and photo-receiving devices should prove advantageous. Those in the art should also appreciate that depending upon the application and factors such as distance, frequency requirements, and the like it will often times be practical to use a simple light-emitting device such as those shown in FIGS. 9A or 13A, rather than an integrated electro-optical device having laser output, such as the DIFET laser of FIG. 12.

As can be appreciated by those skilled in the art, the present invention can be practiced otherwise than as specifically disclosed herein. For example, those skilled in the art will readily be able to design and construct additional integrated electro-optical structures, and communications structures, including those using various types of photo-emitting or photoresponsive DIFETs, photodiodes and photoresistors, especially those of thin film construction using logical and straight-forward combinations of selected features from various embodiments of the present invention. Therefore, it is to be understood that within the scope of the appended claims the invention can be practiced otherwise than has been specifically described above.

We claim:

1. An improved communications system employing electro-optical devices; said system comprising an integrated structure, said structure including very wide band gap, light transmissive conduit means and a plurality of active elements, each element including at least one layer of thin film amorphous silicon alloy material, said active elements distributed adjacent to and integrally formed with said conduit means; at least one of said elements adapted to project light signals within said conduit means in response to electrical signals applied thereto, and at least another one of said elements adapted to detect said light signals transmitted within said conduit means.

2. A system as defined in claim 1, wherein said conduit means include means for confining said light signals within said conduit means.

3. A system as defined in claim 1, wherein said conduit means include at least two end surfaces and further including reflective means overlying said end surfaces for confining said light signals within said conduit means.

4. A system as defined in claim 1, wherein each of said active elements is adapted to generate and detect said light signals.

5. A system as defined in claim 1, wherein at least some of said active elements comprises light-emitting transistors.

6. A system as defined in claim 5, wherein said light-emitting transistors comprise DIFETs.

7. A system as defined in claim 1, wherein said active elements are formed on said conduit means.

8. A system as defined in claim 1 wherein said conduit means are formed over said active elements.

9. A system as defined in claim 1, wherein said conduit means are formed between said active elements.

* * * * *